US012641791B2

(12) United States Patent (10) Patent No.: US 12,641,791 B2
Kwak et al. (45) Date of Patent: May 26, 2026

(54) SEMICONDUCTOR DEVICE AND MANUFACTURING METHOD THEREOF

(71) Applicant: SK hynix Inc., Gyeonggi-do (KR)

(72) Inventors: Rho Gyu Kwak, Gyeonggi-do (KR); In Su Park, Gyeonggi-do (KR); Jung Shik Jang, Gyeonggi-do (KR); Seok Min Choi, Gyeonggi-do (KR); Won Geun Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 541 days.

(21) Appl. No.: 18/193,647

(22) Filed: Mar. 31, 2023

(65) Prior Publication Data

US 2024/0121956 A1 Apr. 11, 2024

(30) Foreign Application Priority Data

Oct. 6, 2022 (KR) ........................ 10-2022-0127524

(51) Int. Cl.
H10B 43/27 (2023.01)
H10B 41/27 (2023.01)
(52) U.S. Cl.
CPC ............. H10B 43/27 (2023.02); H10B 41/27 (2023.02)
(58) Field of Classification Search
CPC ................................ H10B 43/27; H10B 43/20
See application file for complete search history.

(56) References Cited

U.S. PATENT DOCUMENTS

| 10,950,627 B1 | 3/2021 | Hinoue et al. |
| 11,282,850 B2 | 3/2022 | Takashima et al. |
| 2017/0148805 A1 | 5/2017 | Nishikawa et al. |
| 2023/0380160 A1 * | 11/2023 | Lee ........................ H10B 41/10 |

FOREIGN PATENT DOCUMENTS

JP 2020-047754 A 3/2020

OTHER PUBLICATIONS

Office Action for the Korean Patent Application No. 10-2022-0127524 issued by the Korean Intellectual Property Office on Apr. 17, 2026.

* cited by examiner

*Primary Examiner* — Christopher A Johnson
(74) *Attorney, Agent, or Firm* — IP & T GROUP LLP

(57) ABSTRACT

A semiconductor device may include: first insulating pillars arranged in a first direction; second insulating pillars arranged alternately with the first insulating pillars and having a first width in the first direction and a second width in a second direction intersecting the first direction, the first width being greater than the second width; first memory cells located between the second insulating pillars and stacked along a first sidewall of each of the first insulating pillars; and second memory cells located between the second insulating pillars and stacked along a second sidewall of each of the first insulating pillars.

17 Claims, 37 Drawing Sheets

SEMICONDUCTOR DEVICE AND MANUFACTURING METHOD THEREOF

CROSS-REFERENCE TO RELATED APPLICATION

This application claims priority under 35 U.S.C. § 119 to Korean Patent Application No. 10-2022-0127524 filed on Oct. 6, 2022, which is incorporated herein by reference in its entirety.

BACKGROUND

1. Technical Field

Embodiments of the present invention disclosure relate generally to an electronic device, and more particularly, to a semiconductor device and a manufacturing method thereof.

2. Related Art

The degree of integration of a semiconductor device is mainly determined by the area occupied by a unit memory cell. Recently, as improvements in the degree of integration of two-dimensional semiconductor devices which arrange memory cells in a single layer over a substrate have become very difficult if not uneconomical, three-dimensional semiconductor devices which stack multiple layers of memory cells over a substrate have been proposed. Furthermore, to improve the operational reliability of such three-dimensional semiconductor devices, various structures and manufacturing methods have been developed. However, more improvements are needed for increasing the capacity, speed, and reliability of these semiconductor devices while at the same further reducing their size and utility. At present huge amount of research and development efforts are being spent on three-dimensional semiconductor devices.

SUMMARY

The present invention provides an improved three-dimensional semiconductor device referred hereinafter for simplicity as a semiconductor device. Accordingly, in an embodiment, a semiconductor device may include: first insulating pillars arranged in a first direction; second insulating pillars arranged alternately with the first insulating pillars and having a first width in the first direction and a second width in a second direction intersecting the first direction, the first width being greater than the second width; first memory cells located between the second insulating pillars and stacked along a first sidewall of each of the first insulating pillars; and second memory cells located between the second insulating pillars and stacked along a second sidewall of each of the first insulating pillars.

In an embodiment, a semiconductor device may include: a gate structure comprising gate lines and insulating layers that are alternately stacked; first insulating pillars located in the gate structure and arranged in a first direction; second insulating pillars located between the first insulating pillars and comprising insulating layers each having a first width in the first direction and a second width in a second direction intersecting the first direction, the second width being greater than the first width; and memory patterns located in the gate structure and separated from each other by the first insulating pillars and the second insulating pillars.

In an embodiment, a manufacturing method of a semiconductor device may include: forming a stack comprising first material layers and second material layers that are alternately stacked; forming, in the stack, a first opening extending in a first direction and having a first width in a second direction intersecting the first direction; forming a channel layer in the first opening; forming second openings separating the channel layer into channel patterns and each having a second width in the first direction and a third width in the second direction, the second width being greater than the first width; forming, in the second openings, protection patterns surrounding etched surfaces of the channel patterns and exposing the stack; and replacing the first material layers with third material layers through the second openings.

In an embodiment, a manufacturing method of a semiconductor device may include: forming a stack comprising first material layers and second material layers that are alternately stacked; forming a first opening in the stack; forming a cell structure in the first opening; forming, in the stack, a second opening separating the cell structure into cell patterns and exposing the stack between the cell patterns; forming, in the second opening, protection patterns surrounding etched surfaces of the cell patterns; and replacing the first material layers with third material layers through the second opening.

In an embodiment, a semiconductor device may include: a first insulating pillar; a first memory cell including a first channel pattern, the first channel pattern being in contact with a first sidewall of the first insulating pillar; a second memory cell including a second channel pattern, the second channel pattern being in contact with a second sidewall of the first insulating pillar, wherein the first memory cell and the second memory cell are spaced apart from each other with the first insulating pillar interposed therebetween.

BRIEF DESCRIPTION OF THE DRAWINGS

FIGS. 4A, 5A, 6A, 7A, 8A, 9A, 10A and 11A, FIGS. 4B, 5B, 6B, 7B, 8B, 9B, 10B and 11B, and FIGS. 4C, 5C, 6C, 7C, 8C, 9C, 10C and 11C are diagrams for describing a manufacturing method of a semiconductor device in accordance with an embodiment of the present invention.

FIG. 12A to FIG. 12C and FIG. 13A to FIG. 13C are diagrams for describing a manufacturing method of a semiconductor device in accordance with an embodiment of the present invention.

DETAILED DESCRIPTION

Various embodiments are directed to a semiconductor device having a stable structure and improved characteristics and a manufacturing method thereof.

By stacking memory cells in three dimensions, it is possible to improve the degree of integration of a semiconductor device. However, the stability and reliability of such three-dimensional structures is more challenging. According to the present invention, it is possible to provide a semiconductor device having a three-dimensional stacking of the memory cells, a stable structure and improved reliability.

Hereafter, embodiments in accordance with the technical spirit of the present invention disclosure will be described with reference to the accompanying drawings.

Figure 1A:
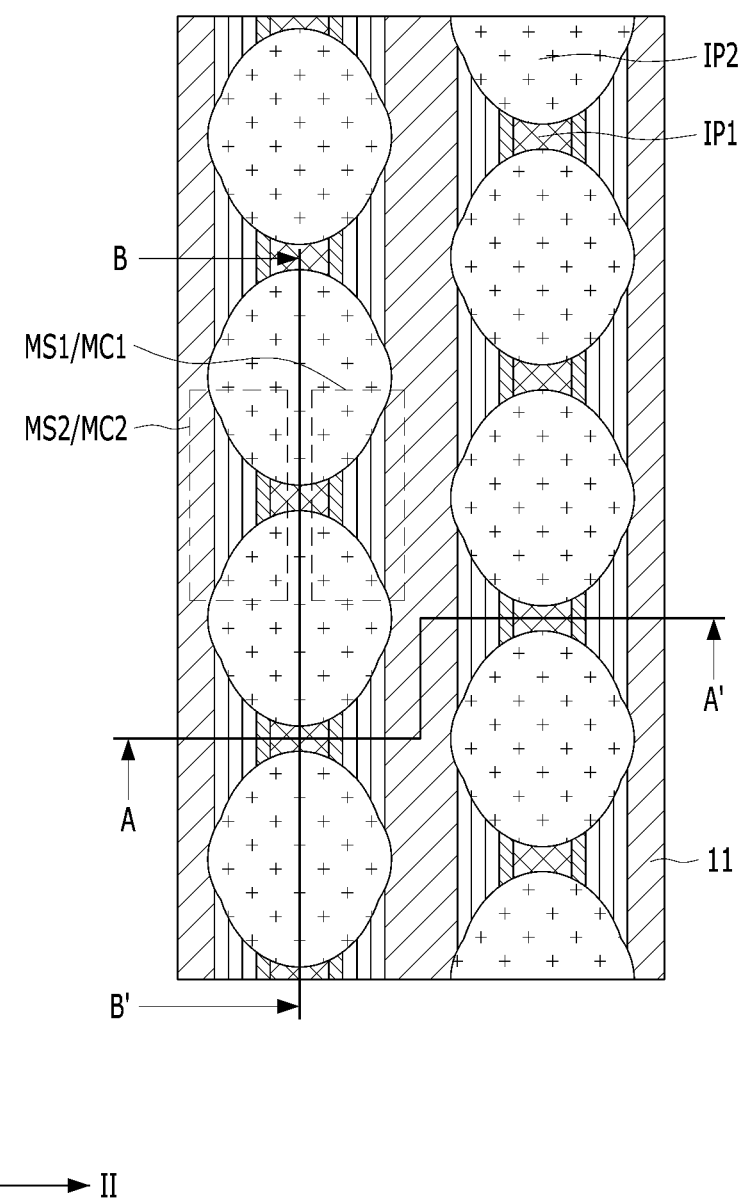
FIG. 1A to FIG. 1C are diagrams illustrating a structure of a semiconductor device in accordance with an embodiment of the present invention.
Figure 1B:
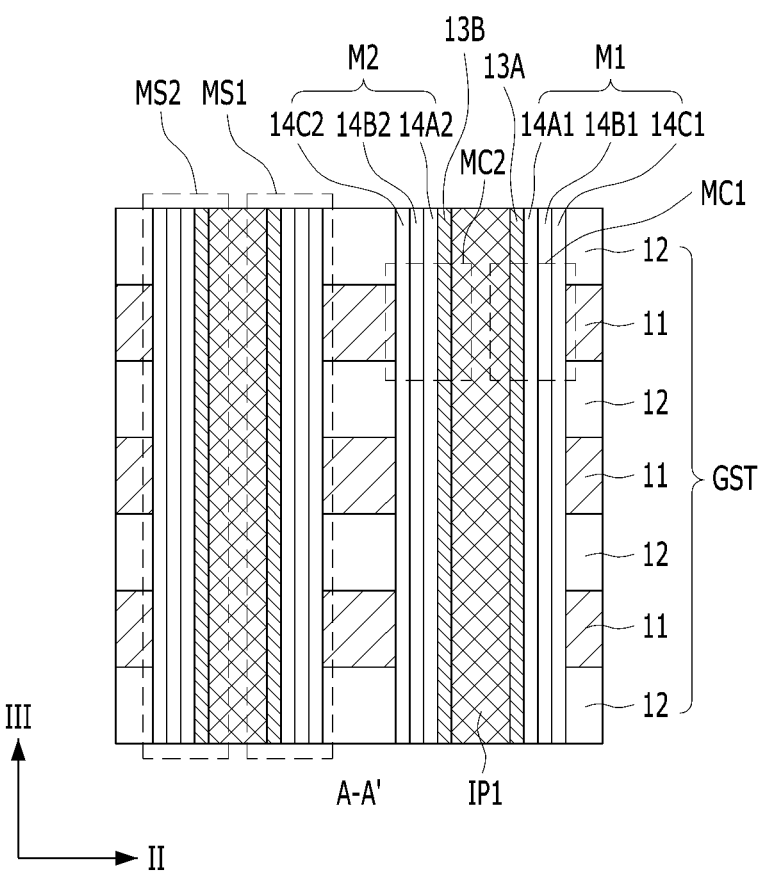
Figure 1C:
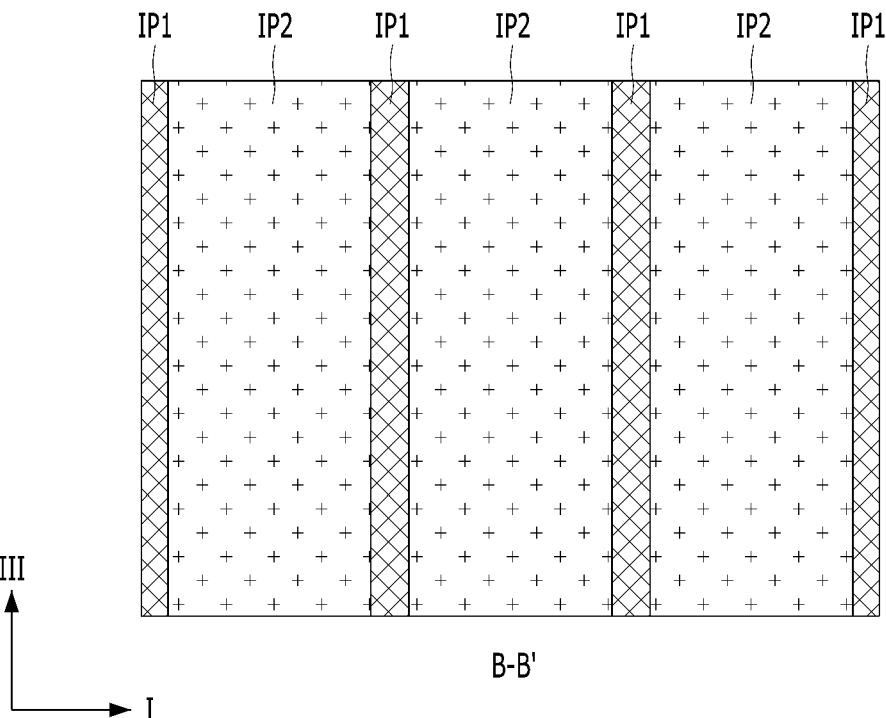

FIG. 1A to FIG. 1C are diagrams illustrating a structure of a semiconductor device in accordance with an embodiment of the present invention. FIG. 1A is a plan view, FIG. 1B is a cross-sectional view taken along line A-A' in FIG. 1A, and FIG. 1C is a cross-sectional view taken along line B-B' in FIG. 1A.

Referring to FIG. 1A to FIG. 1C, the semiconductor device may include first insulating pillars IP1, second insulating pillars IP2, first memory cells MC1, and second memory cells MC2. The semiconductor device may further include a gate structure GST.

The gate structure GST may include gate lines 11 and insulating layers 12 that are alternately stacked. The gate lines 11 may be word lines, bit lines, select lines, or the like, and may be electrically connected to gate electrodes of a select transistor, a memory cell, or the like. The gate lines 11 may extend in a first direction I. In an embodiment, the gate lines 11 may each include a conductive material such as polysilicon, tungsten, or molybdenum, or a combination thereof. The insulating layers 12 may be used to insulate stacked gate electrodes from each other. In an embodiment, the insulating layers 12 may each include an insulating material such as oxide, nitride, or an air gap.

The first insulating pillars IP1 may be located in the gate structure GST. The first insulating pillars IP1 may be arranged in the first direction I, in a second direction II intersecting the first direction I, or in the first direction I and the second direction II. In an embodiment, the first insulating pillars IP1 may pass through the gate structure GST and may extend in a third direction III. The third direction III may be a direction protruding from a plane defined by the first direction I and the second direction II. The third direction III may be a stacking direction of the gate lines 11.

The second insulating pillars IP2 may be located in the gate structure GST. The second insulating pillars IP2 may be arranged alternately with the first insulating pillars IP1. The second insulating pillars IP2 may be arranged in the first direction I, in the second direction II, or in both the first direction I and the second direction II. In an embodiment, the second insulating pillars IP2 may pass through the gate structure GST and may extend in the third direction III.

The first memory cells MC1 and the second memory cells MC2 may be located between the second insulating pillars IP2. In an embodiment, the first memory cells MC1 and the second memory cells MC2 may be located between the second insulating pillars IP2 adjacent to each other in the first direction I.

The first memory cells MC1 may be stacked along a first sidewall SW1 of the first insulating pillar IP1. Each of the first memory cells MC1 may include a first channel pattern 13A, and may further include a first memory pattern M1. The first memory pattern M1 may include a first tunneling pattern 14A1, a first data storage pattern 14B1, or a first blocking pattern 14C1, or a combination thereof.

The second memory cells MC2 may be stacked along a second sidewall SW2 of the first insulating pillar IP1. Each of the second memory cells MC2 may include a second channel pattern 13B, and may further include a second memory pattern M2. The second memory pattern M2 may include a second tunneling pattern 14A2, a second data storage pattern 14B2, or a second blocking pattern 14C2, or a combination thereof.

Figure 2A:
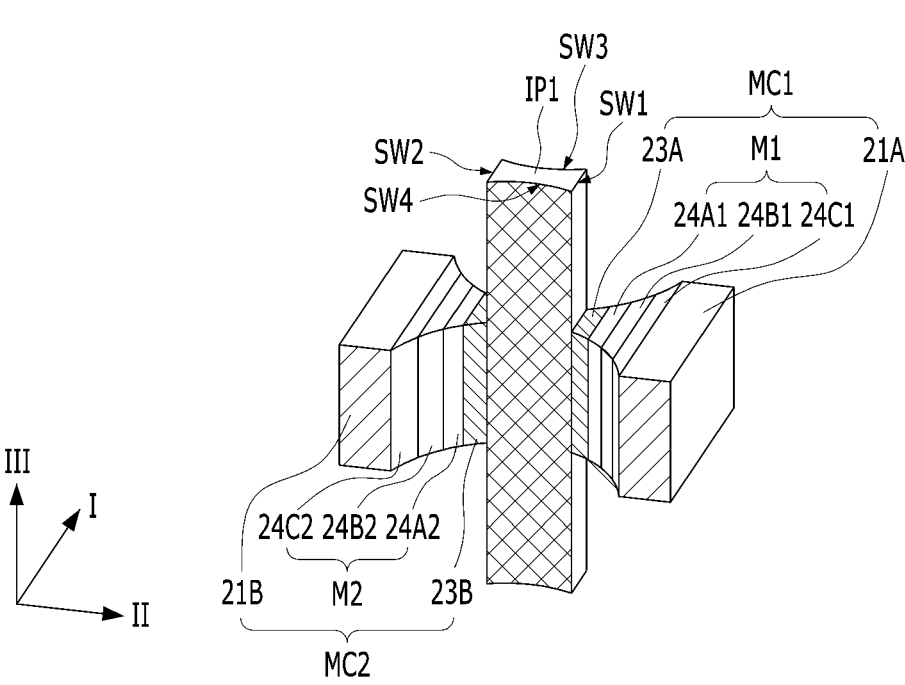
FIG. 2A and FIG. 2B are diagrams illustrating a structure of a semiconductor device in accordance with an embodiment of the present invention.
Figure 2B:
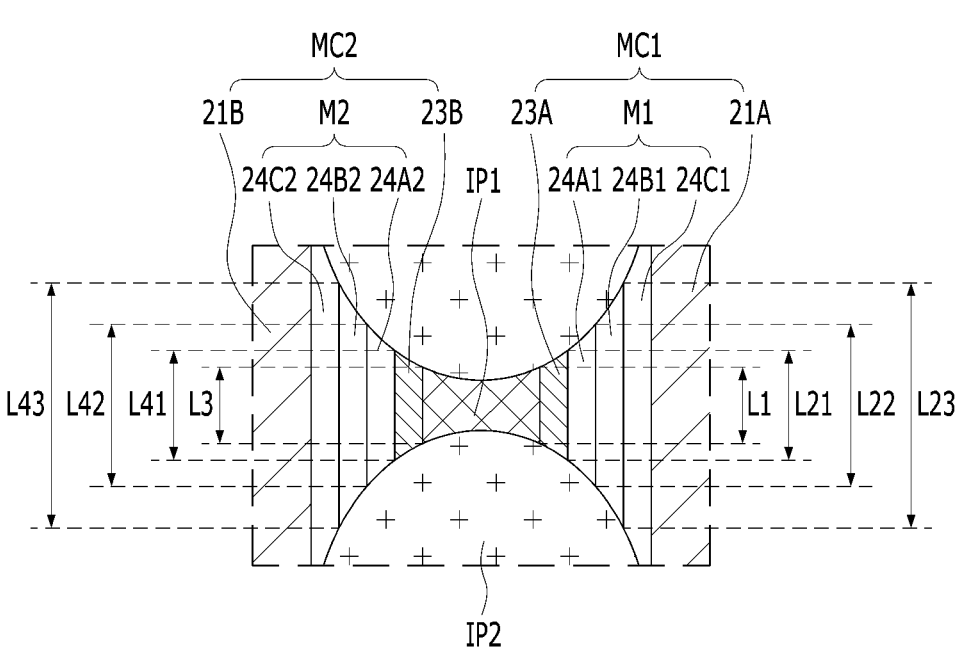

According to the structure described above, the first memory cells MC1 and the second memory cells MC2 may be stacked in spaces separated by the first insulating pillars IP1 and the second insulating pillars IP2. In an embodiment, a first memory string MS1 may be located on the first sidewall SW1, and may include at least one source select transistor, the first memory cells MC1, and at least one drain select transistor stacked along the first sidewall SW1. A second memory string MS2 may be located on the second sidewall SW2, and may include at least one source select transistor, the second memory cells MC2, and at least one drain select transistor stacked along the second sidewall SW2. Accordingly, the degree of integration of the semiconductor device may be improved. FIG. 2A and FIG. 2B are diagrams illustrating a structure of a semiconductor device in accordance with an embodiment of the present invention. FIG. 2A is a perspective view and FIG. 2B is a plan view. Hereinafter, the content overlapping with previously described content may be omitted.

Referring to FIG. 2A and FIG. 2B, the first insulating pillar IP1 may include the first sidewall SW1 and the second sidewall SW2 facing each other in the second direction II. The first sidewall SW1 and the second sidewall SW2 may be deposited surfaces formed by deposition process. The first sidewall SW1 and the second sidewall SW2 may be flat surfaces. The first insulating pillar IP1 may include a third sidewall SW3 and a fourth sidewall SW4 facing each other in the first direction I. The third sidewall SW3 and the fourth sidewall SW4 may be etched surfaces. The third sidewall SW3 and the fourth sidewall SW4 may each include a curved surface. The third sidewall SW3 and the fourth sidewall SW4 may be in contact with the second insulating pillar IP2.

As shown in FIG. 2A, the first memory cell MC1 may be located on the first sidewall SW1 of the first insulating pillar IP1. The first memory cell MC1 may include a first channel pattern 23A, a first memory pattern M1, and a first gate electrode 21A. The first channel pattern 23A may surround or cover the first sidewall SW1, and the first memory pattern M1 may surround or cover the first channel pattern 23A. In an embodiment, a first tunneling pattern 24A1 may surround or cover the first channel pattern 23A, a first data storage pattern 24131 may surround or cover the first tunneling pattern 24A1, and a first blocking pattern 24C1 may surround or cover the first data storage pattern 2461. A sidewall of the first channel pattern 23A and a sidewall of the first memory pattern M1 may be etched surfaces connected to the third sidewall SW3 or the fourth sidewall SW4 of the first insulating pillar IP1, and may each have a curved surface. In an embodiment, the first channel pattern 23A and the first memory pattern M1 may have the same or substantially the same length. In an embodiment, the first channel pattern 23A and the first memory pattern M1 may have different lengths from each other. The first channel pattern 23A may have a first length L1 in the first direction I. The first memory pattern M1 may surround or cover the first channel pattern 23A with a length longer than the first length L1. In an embodiment, the first tunneling pattern 24A1 may have a second length L21 longer than the first length L1, and the first data storage pattern 24B1 may have a second length L22 longer length than the second length L21, and the first blocking pattern 24C1 may have a second length L23 longer than the second length L22. In an embodiment, the patterns may have a uniform width or a varying width. In comparing the lengths of the patterns having varying width, the length of each pattern may be an average length, a minimum length, or a maximum length.

The second memory cell MC2 may be located on the second sidewall SW2 of the first insulating pillar IP1. The second memory cell MC2 may include a second channel pattern 23B, a second memory pattern M2, and a second gate electrode 21B. The second memory cell MC2 may face the first memory cell MC1 in the second direction II with the first insulating pillar IP1 interposed therebetween. The second channel pattern 23B may surround or cover the second sidewall SW2, and the second memory pattern M2 may surround or cover the second channel pattern 23B. In an embodiment, a second tunneling pattern 24A2 may surround or cover the second channel pattern 23B, a second data storage pattern 24B2 may surround or cover the second tunneling pattern 24A2, and a second blocking pattern 24C2 may surround or cover the second data storage pattern 24B2. A sidewall of the second channel pattern 23B and a sidewall of the second memory pattern M2 may be etched surfaces connected to the third sidewall SW3 or the fourth sidewall SW4 of the first insulating pillar IP1, and may each have a curved surface.

In an embodiment, the second channel pattern 23B and the second memory pattern M2 may have the same or substantially the same length. In an embodiment, the second channel pattern 23B and the second memory pattern M2 may have different lengths from each other. The second channel pattern 23B may have a third length L3 in the first direction I. The second memory pattern M2 may surround or cover the second channel pattern 23B with a length longer than the third length L3. In an embodiment, the second tunneling pattern 24A2 may have a fourth length L41 longer than the third length L3, and the second data storage pattern 24B2 may have a fourth length L42 longer length than the fourth length L41, and the second blocking pattern 24C2 may have a fourth length L43 longer than the fourth length L42.

The second memory cell MC2 may have a structure similar to that of the first memory cell MC1. In an embodiment, a pair of first memory cell MC1 and second memory cell MC2 located to face each other with the first insulating pillar IP1 therebetween may have a symmetrical structure. A width of the first memory cell MC1 and a width of the second memory cell MC2 in the first direction I may increase as the first memory cell MC1 and the second memory cell MC2 are far away from the first insulating pillar IP1. In an embodiment, the first memory cell MC1 and the second memory cell MC2 may each have a trapezoidal shape in plan view.

Figure 3A:
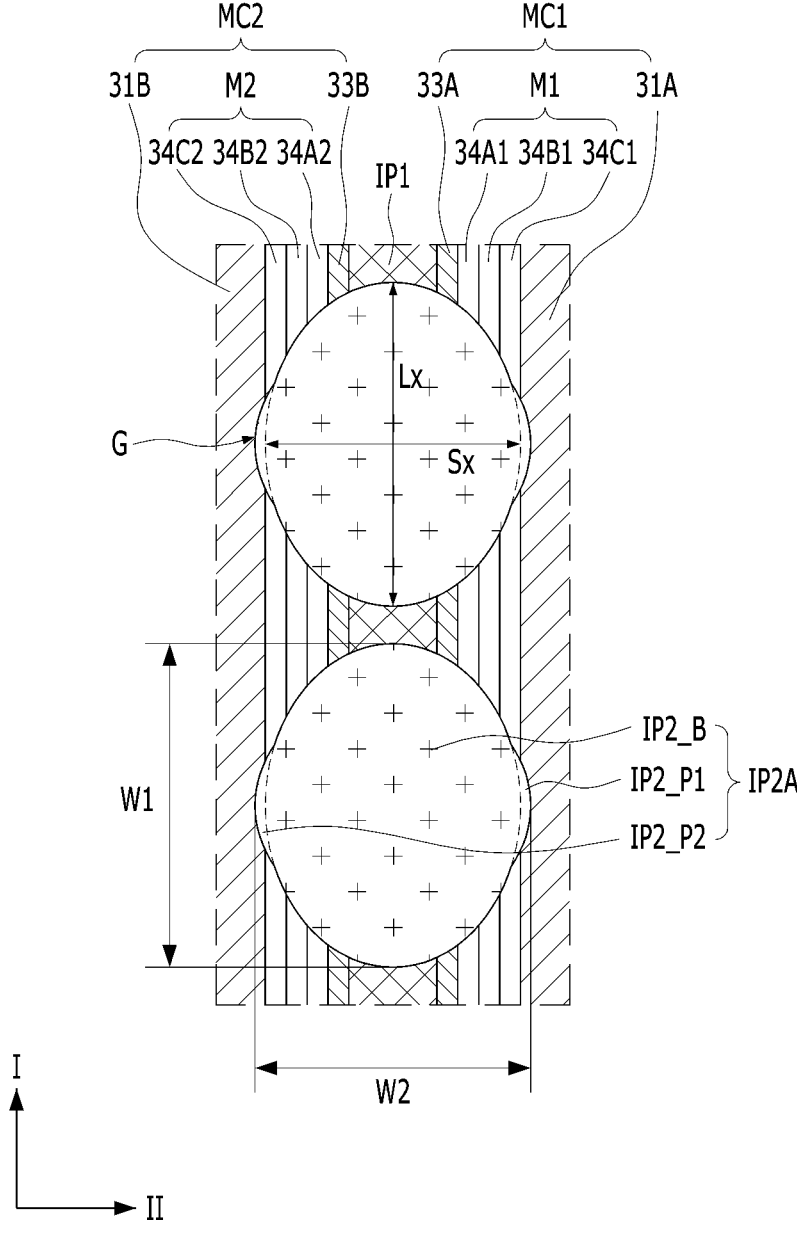
FIG. 3A and FIG. 3B are diagrams illustrating a structure of a semiconductor device in accordance with an embodiment of the present invention.
Figure 3B:
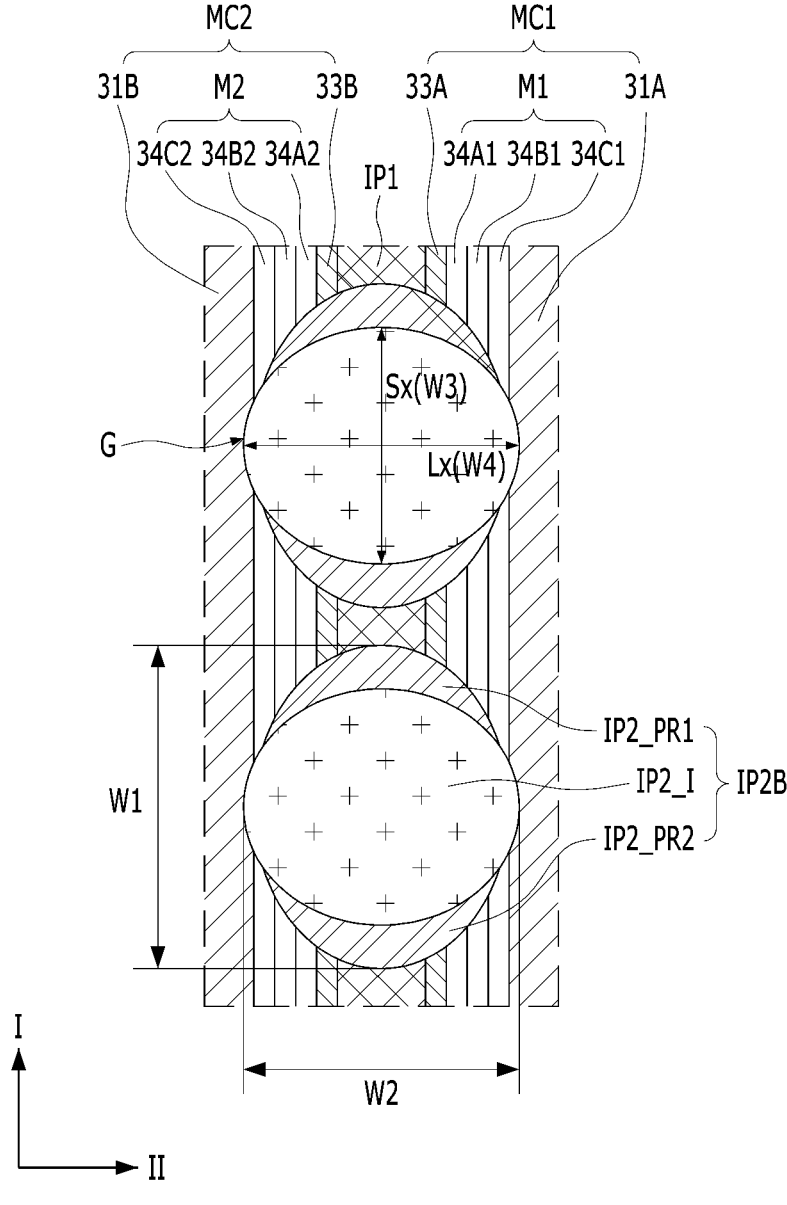

FIG. 3A and FIG. 3B are diagrams illustrating a structure of a semiconductor device in accordance with an embodiment of the present invention. FIG. 3A and FIG. 3B are plan views. Hereinafter, the content overlapping with the previously described content may be omitted.

Referring to FIG. 3A and FIG. 3B, a second insulating pillar IP2A may separate first memory cells MC1 adjacent in the first direction I from each other. Each of the first memory cells MC1 may include a first channel pattern 33A, a first memory pattern M1, and first gate line 31A, and the first memory pattern M1 may include a first tunneling pattern 34A1, a first data storage pattern 3461, and a first blocking pattern 34C1.

The second insulating pillar IP2A may separate second memory cells MC2 adjacent in the first direction I from each other. Each of the second memory cells MC2 may include a second channel pattern 33B, a second memory pattern M2, and second gate line 31B, and the second memory pattern M2 may include a second tunneling pattern 34A2, a second data storage pattern 34B2, and a second blocking pattern 34C2.

The second insulating pillars IP2A may be arranged alternately with the first insulating pillars IP1 along the first direction I. The second insulating pillar IP2A may have a first width W1 in the first direction I and a second width W2 in the second direction II, and the first width W1 may be greater than the second width W2. The second insulating pillar IP2A may have a plane shape such as a polygon or an ellipse. The second insulating pillar IP2A may be configured as a single layer or a multilayer layer.

Referring to FIG. 3A, the second insulating pillar IP2A may include a body IP2_B and one or more protrusions IP2_P1 and IP2_P2. The second insulating pillar IP2A may be a single layer including the body IP2_B, a first protrusion IP2_P1, and a second protrusion IP2_P2. The body IP2_B may include a long axis Lx extending in the first direction I and a short axis Sx extending in the second direction II. The long axis Lx may have a length substantially the same as the first width W1, and the short axis Sx may have a length smaller than the second width W2. The body IP2_B may have a plane shape such as a polygon or an ellipse.

The first protrusion IP2_P1 may protrude between the first memory cells MC1 from the body IP2_B. The first protrusion IP2_P1 may protrude into a first gate line 31A from a sidewall of the body IP2_B. The second protrusion IP2_P2 may protrude between the second memory cells MC2 from the body IP2_B. The second protrusion IP2_P2 may protrude into a second gate line 31B from the sidewall of the body IP2_B. Each of the first gate lines 31A may include grooves G located between the first memory cells MC1. Each of the second gate lines 31B may include grooves G located between the second memory cells MC2. The first protrusions IP2_P1 and the second protrusions IP2_P2 may be located in the grooves G, respectively.

Referring to FIG. 3B, the second insulating pillar IP2B may include an insulating layer IP2_I and one or more protection patterns IP2_PR1 and IP2_PR2. The insulating layer IP2_I, a first protection pattern IP2_PR1, and a second protection pattern IP2_PR2 may be separate layers, and the second insulating pillar IP2B may be configured as a multilayer layer. The insulating layer IP2_I may include a long axis Lx extending in the second direction II and a short axis Sx extending in the first direction I. The short axis Sx may have a fourth width W4, and the long axis Lx may have a third width W3 greater than the fourth width W4. The fourth width W4 may be substantially the same as the second width W2, and the third width W3 may be smaller than the first width W1. The insulating layer IP2_I may have a plane shape such as a polygon or an ellipse.

The first protection pattern IP2_PR1 and the second protection pattern IP2_PR2 may be located between the insulating layer IP2_I and the first insulating pillars IP1. The first protection pattern IP2_PR1 and the second protection pattern IP2_PR2 may face each other in the first direction I with the insulating layer IP2_I interposed therebetween. The first protection pattern IP2_PR1 and the second protection pattern IP2_PR2 may be used to protect the first channel pattern 13A, the first memory pattern M1, the second channel pattern 13B, and the second memory pattern M2 in the manufacturing process.

FIGS. 4A, 5A, 6A, 7A, 8A, 9A, 10A and 11A, FIGS. 4B, 5B, 6B, 7B, 8B, 9B, 10B and 11B, and FIGS. 4C 5C, 6C, 7C, 8C, 9C, 10C and 11C are diagrams for describing a manufacturing method of a semiconductor device in accordance with an embodiment of the present invention. FIGS. 4A, 5A, 6A, 7A, 8A, 9A, 10A and 11A are plan views. FIGS. 4B, 5B, 6B, 7B, 8B, 9B, 10B and 11B are cross-sectional views taken along lines C-C' in FIGS. 4A, 5A, 6A, 7A, 8A, 9A, 10A and 11A, respectively, and FIGS. 4C 5C, 6C, 7C, 8C, 9C, 10C and 11C are cross-sectional views taken along lines D-D' in FIGS. 4A, 5A, 6A, 7A, 8A, 9A, 10A and 11A, respectively.

Figure 4A:
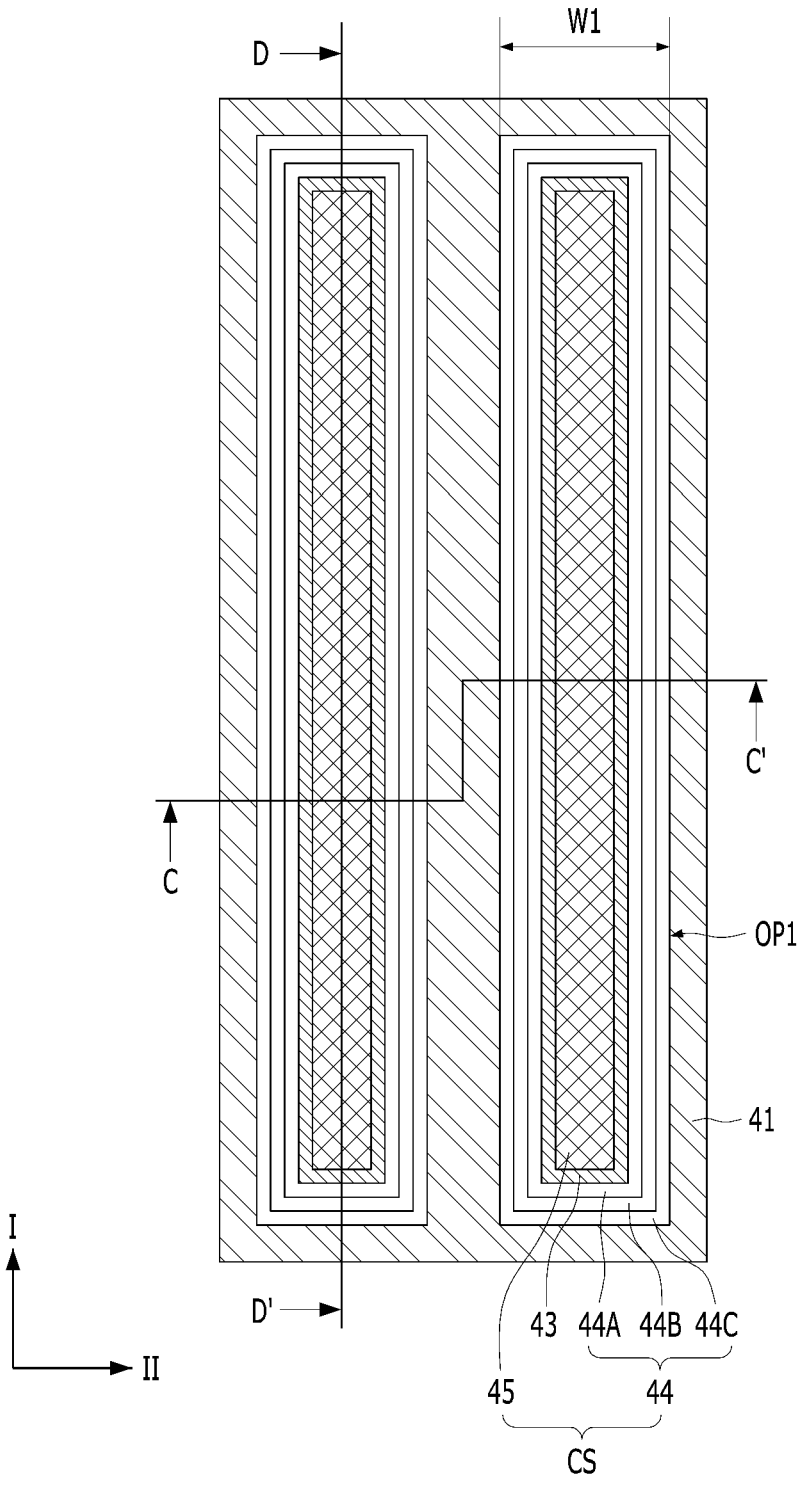
Figure 4B:
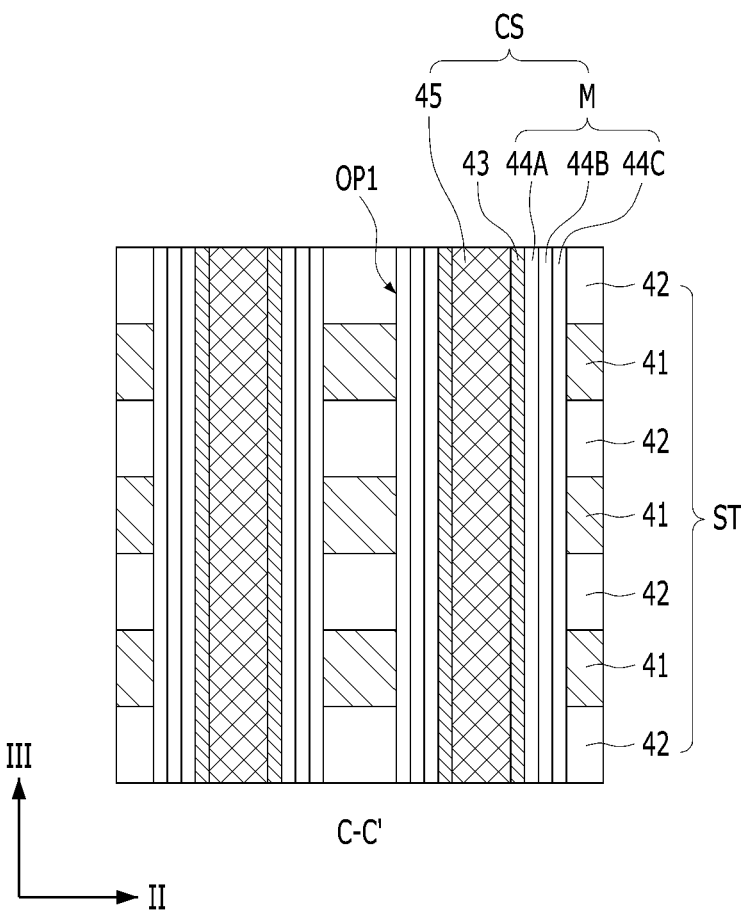
Figure 4C:
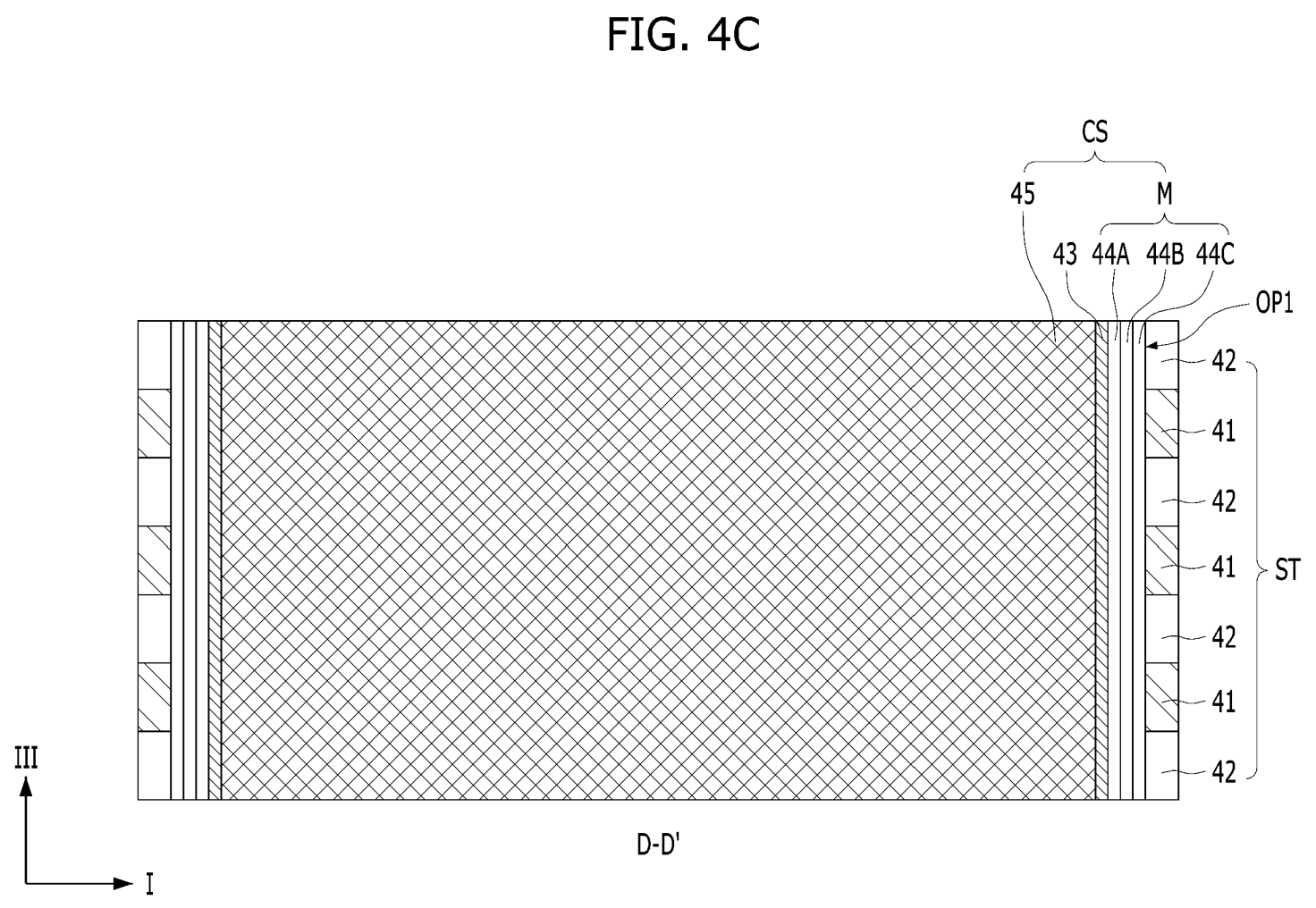

Referring to FIG. 4A to FIG. 4C, a stack ST may be formed. In an embodiment, the stack ST may be formed on a substrate including a lower structure such as a source line and a peripheral circuit. The stack ST may include first material layers 41 and second material layers 42 that are alternately stacked. The first material layers 41 may be used to form a gate line such as a word line, a bit line, and a select line, and the second material layers 42 may be used to form an insulating layer. The first material layers 41 may each include a material having a high etching selectivity with respect to the second material layers 42. For example, the first material layers 41 may each include a sacrificial material such as nitride, and the second material layers 42 may each include an insulating material such as oxide. In another example, the first material layers 41 may each include a conductive material such as polysilicon, tungsten, or molybdenum, and the second material layers 42 may each include an insulating material such as oxide.

Subsequently, a first opening OP1 may be formed in the stack ST. In a plane defined in the first direction I and the second direction II, the first opening OP1 may have a first width W1 in the second direction II. The first opening OP1 may extend in the first direction I and may have a line shape. The first opening OP1 may pass through the stack ST in the third direction III.

Subsequently, a cell structure CS may be formed in the first opening OP1. The cell structure CS may include a memory layer 44 and a channel layer 43, and may further include an insulating layer 45 within the channel layer 43. In an embodiment, the memory layer 44 may be formed by forming a blocking layer 44C, a data storage layer 44B, and a tunneling layer 44A in the first opening OP1. Subsequently, the channel layer 43 may be formed in the memory layer 44, and the insulating layer 45 may be formed in the channel layer 43.

Figure 5A:
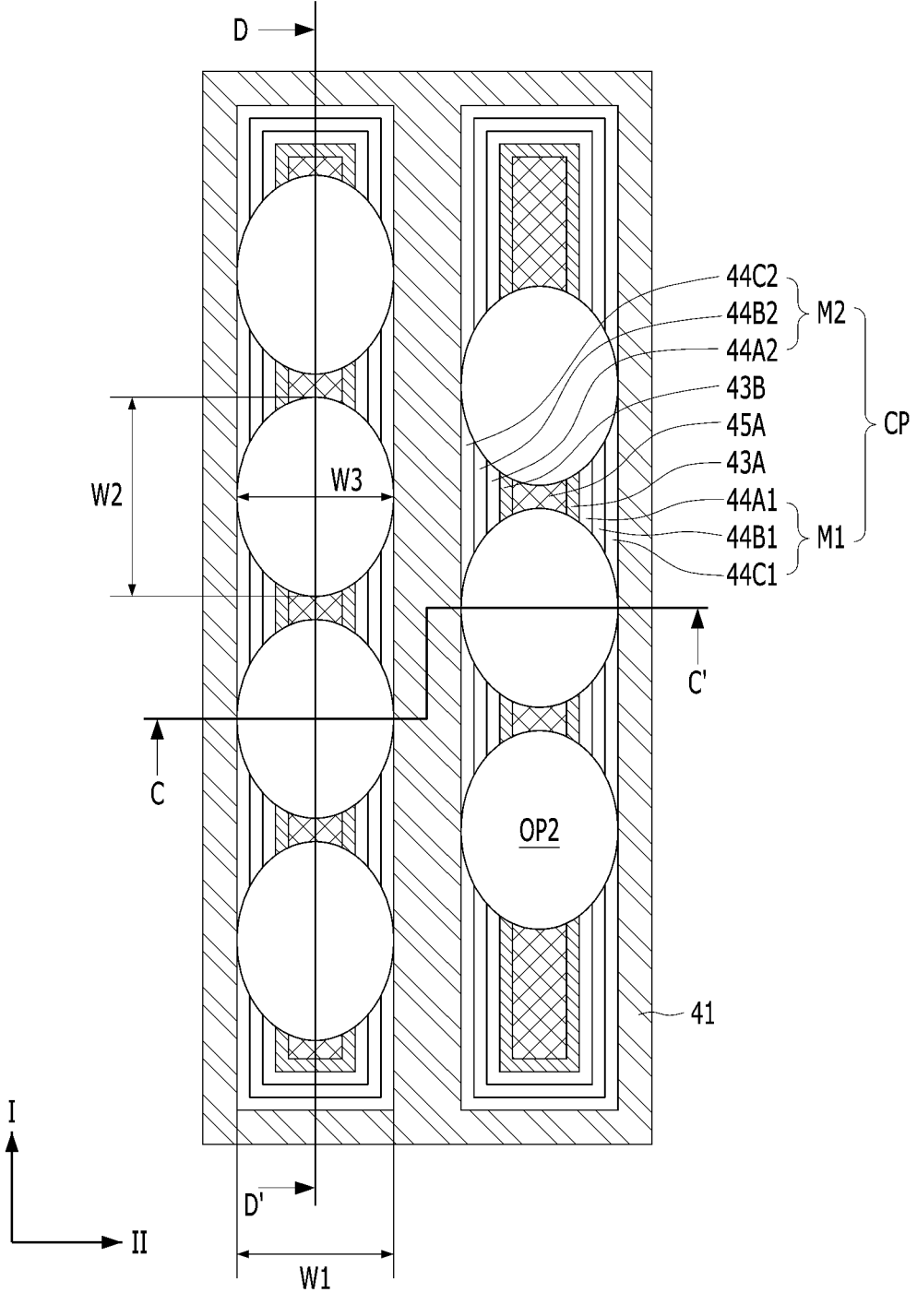
Figure 5B:
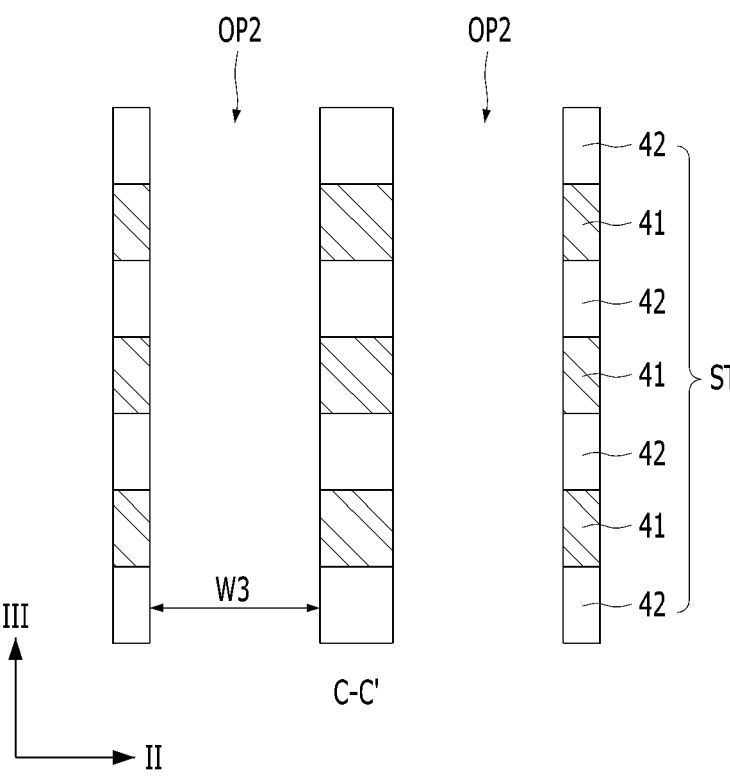
Figure 5C:
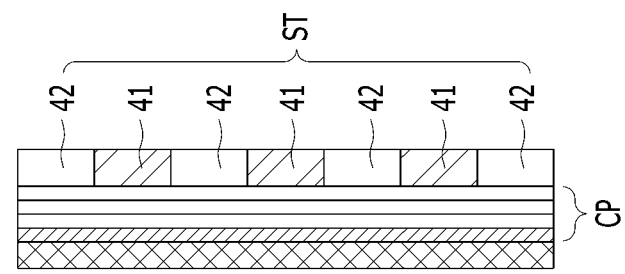
Figure 5C:
Figure 5C:
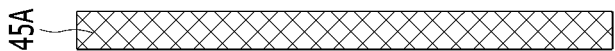
Figure 5C:
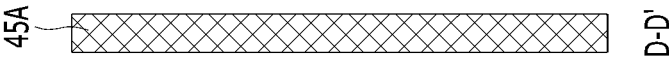
Figure 5C:
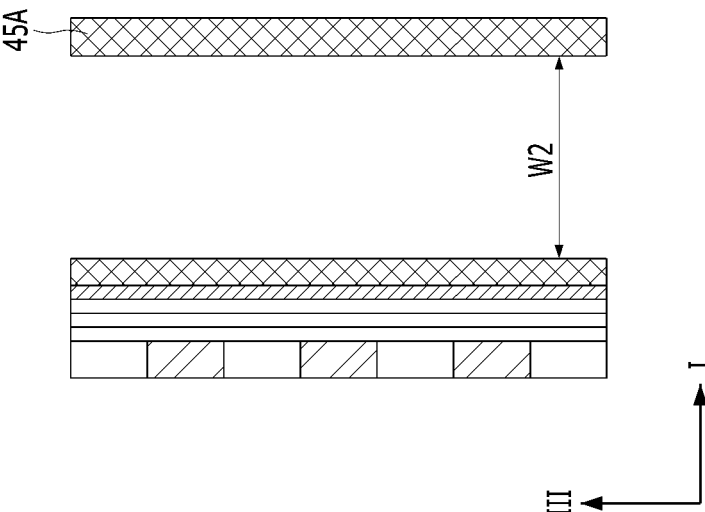

Referring to FIG. 5A to FIG. 5C, second openings OP2 may be formed in the stack ST. Each of the second openings OP2 may have a second width W2 in the first direction I and a third width W3 in the second direction II. The second width W2 may be greater than each of the first width W1 and the third width W3. The third width W3 may be substantially the same as the first width W1 or may be different from the first width W1. Each of the second openings OP2 may have a plane shape such as a polygon or an ellipse. The second openings OP2 may pass through the stack ST in the third direction III.

The second openings OP2 may pass through the cell structure CS. The cell structure CS may be separated into cell patterns CP by the second openings OP2, and the stack ST may be exposed between the cell patterns CP. The cell patterns CP may each include a first insulating pillar 45A, a first channel pattern 43A, a first memory pattern M1, a second channel pattern 43B, and a second memory pattern M2. The first memory pattern M1 may include a first tunneling pattern 44A1, a first data storage pattern 4461, or a first blocking pattern 44C1, or a combination thereof. The second memory pattern M2 may include a second tunneling pattern 44A2, a second data storage pattern 44132, or a second blocking pattern 44C2, or a combination thereof.

In an embodiment, the second openings OP2 may be formed by etching the insulating layer 45, the channel layer 43, and the memory layer 44. The first insulating pillars 45A arranged in the first direction I may be formed by etching the insulating layer 45. The first channel patterns 43A and the second channel patterns 43B may be formed by etching the channel layer 43. The first channel patterns 43A and the second channel patterns 43B may face each other in the second direction II with the first insulating pillars 45A interposed therebetween. The first memory patterns M1 and the second memory patterns M2 may be formed by etching a memory layer M. The first memory patterns M1 may surround the first channel patterns 43A and the second memory patterns M2 may surround the second channel patterns 43B, respectively. Etched surfaces of the first channel patterns 43A, the second channel patterns 43B, the first memory patterns M1, and the second memory patterns M2 may be defined by the second openings OP2. The etched surfaces may each include a curved surface.

Figure 6A:
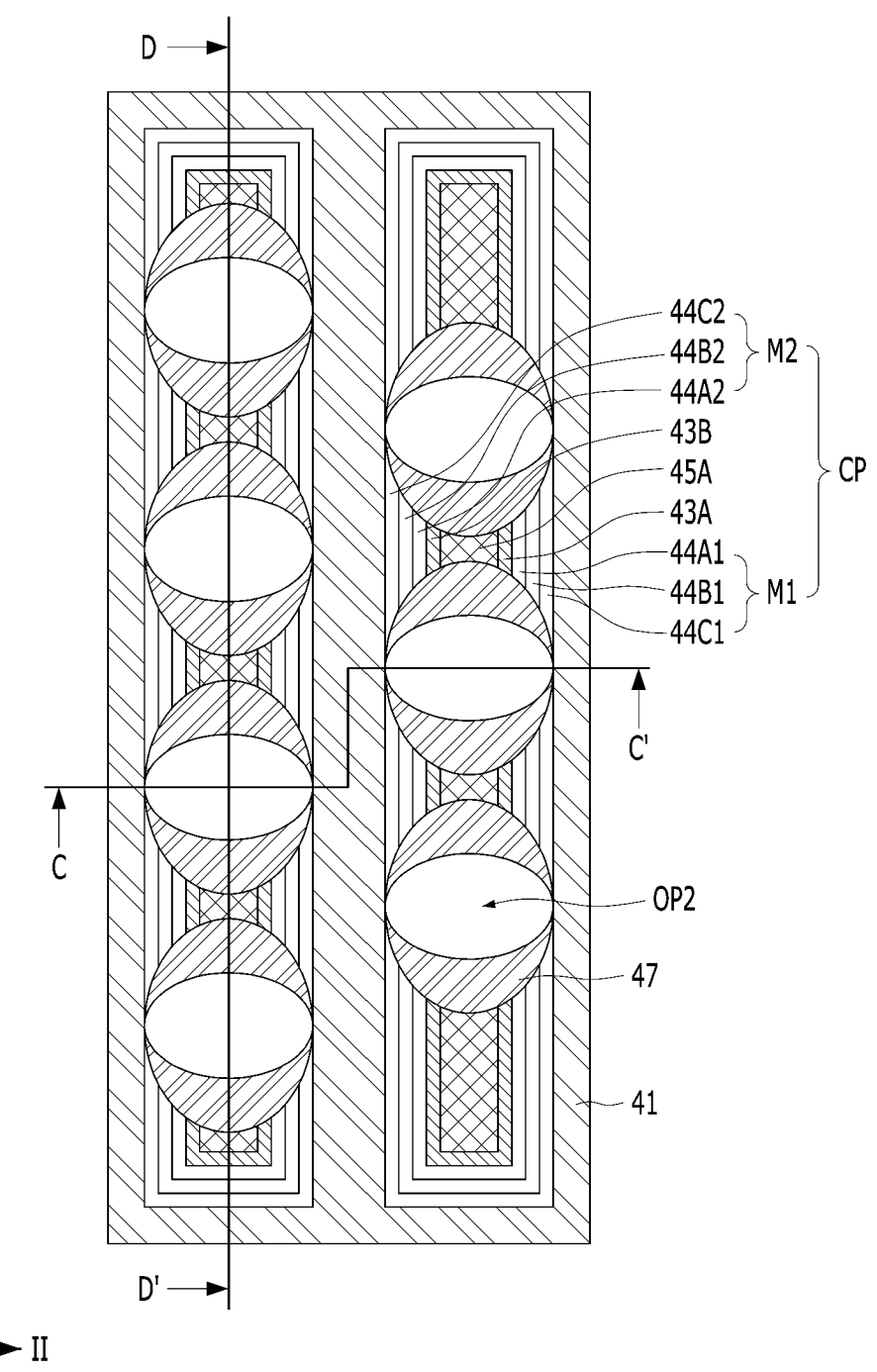
Figure 6B:
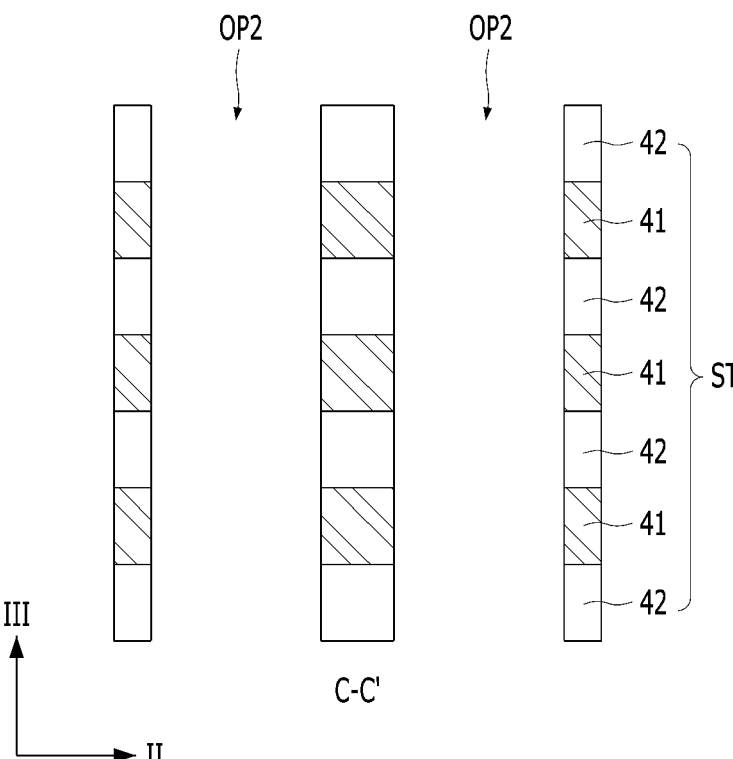
Figure 6C:
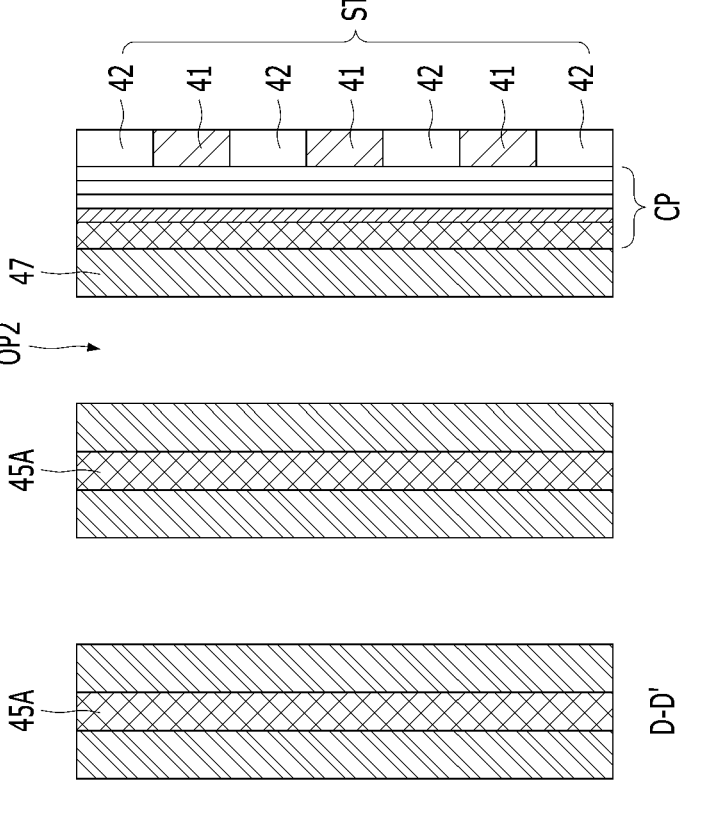
Figure 6C:
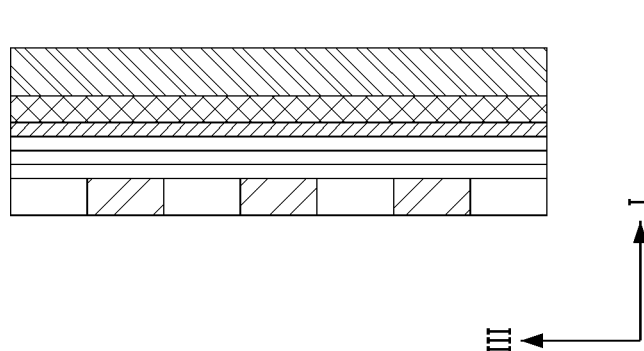

Referring to FIG. 6A to FIG. 6C, a protective layer 47 may be formed in each of the second openings OP2. The protective layer 47 may include a material having a high etching selectivity with respect to the first material layers 41. In an embodiment, the first material layers 41 may each include nitride and the second material layers 42 may each include polysilicon, oxide, or the like.

The protective layer 47 may be formed by a deposition method such as chemical vapor deposition or atomic layer deposition. The protective layer 47 may be formed along an inner surface of the second opening OP2. The protective layer 47 may be formed to have a non-uniform thickness. The deposition environment of the protective layer 47 may vary according to the shape of the second opening OP2, and the protective layer 47 may be deposited with different thicknesses depending on the area. In an embodiment, when the second opening OP2 has a long axis in the first direction I and a short axis in the second direction II, the protective layer 47 may be deposited with a greater thickness in an area close to the long axis than in an area close to the short axis. The protective layer 47 may be deposited with a greater thickness on an etched surface of the cell pattern CP than on the sidewall of the stack ST exposed through the second opening OP2.

Figure 7A:
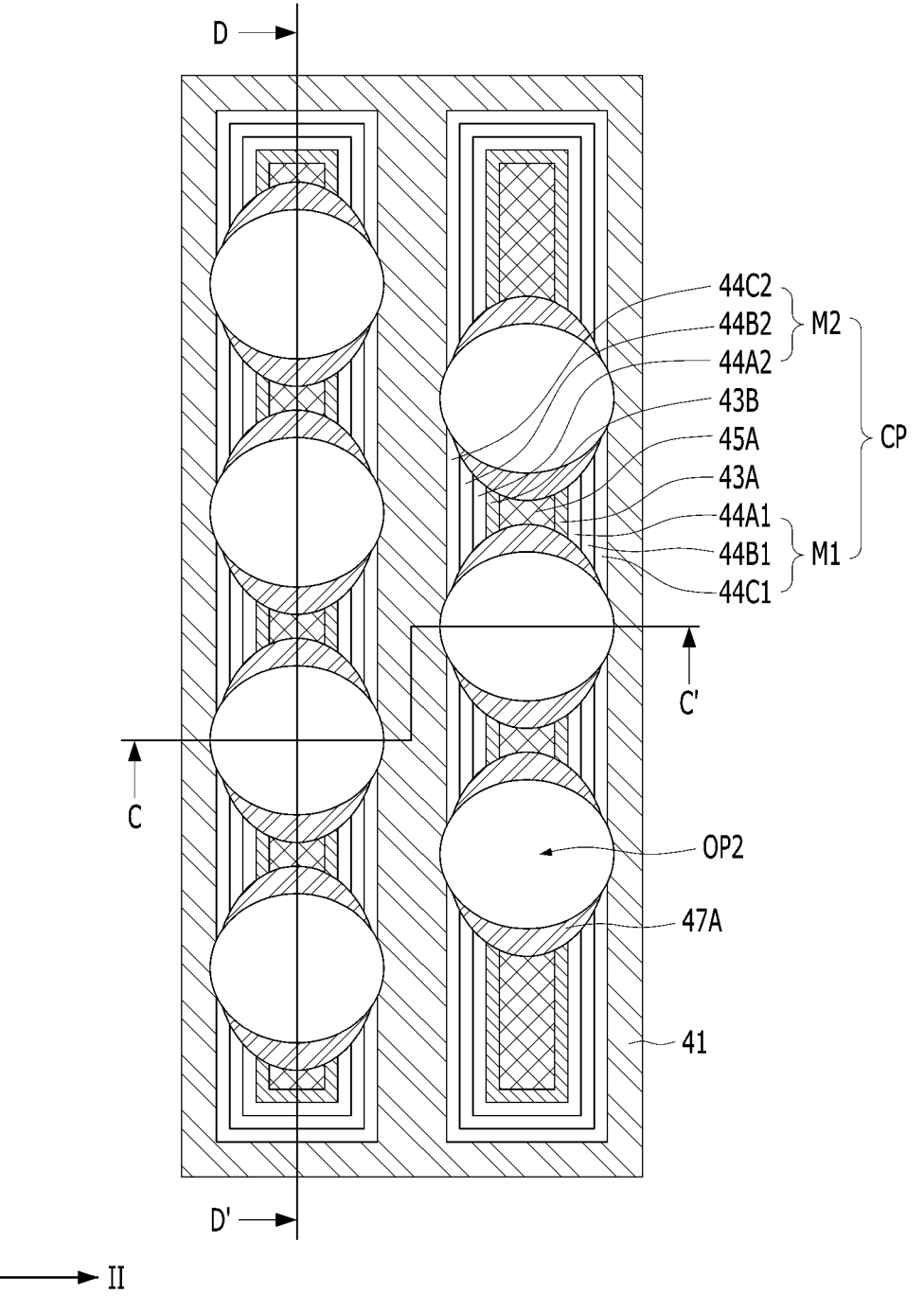
Figure 7B:
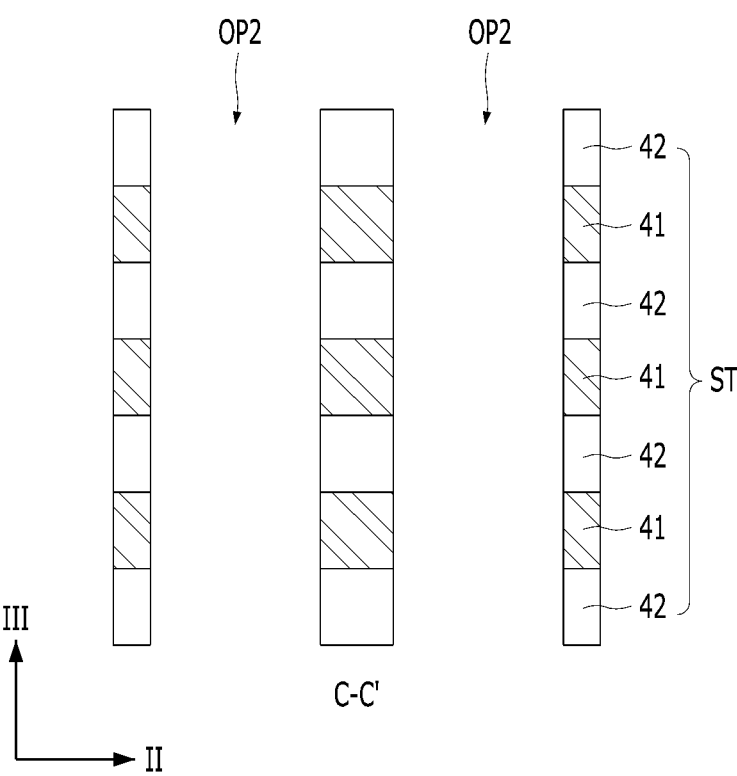
Figure 7C:
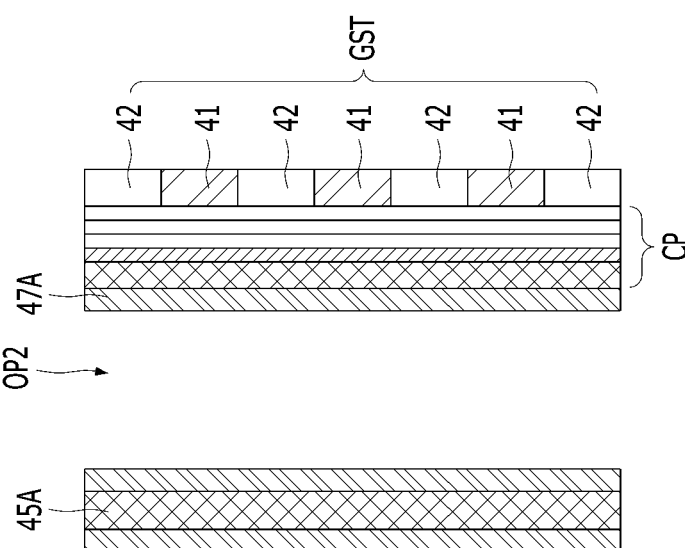
Figure 7C:
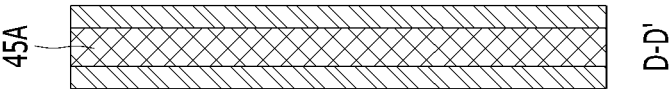
Figure 7C:
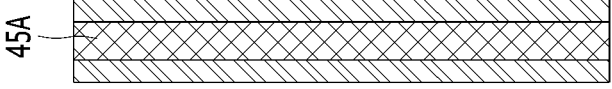
Figure 7C:
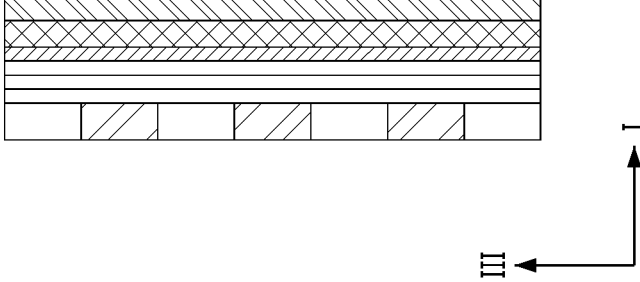

Referring to FIG. 7A to FIG. 7C, protection patterns 47A may be formed by etching the protective layer 47. In an embodiment, the protective layer 47 may be wet-etched. During the etching process, the protective layer 47 may be removed in an area where the protective layer 47 is thinly deposited, and may remain in an area where the protective layer 47 is thickly deposited. Accordingly, the protection patterns 47A may be formed in an area where the protective layer 47 is formed to be relatively thick. The protection pattern 47A may be formed on the etched surface of the cell pattern CP. In an embodiment, each of the protection patterns 47A may surround the etched surfaces of the first insulating pillar 45A, the first channel patterns 43A, the second channel patterns 43B, the first memory patterns M1, and the second memory patterns M2.

At least one protection pattern 47A may be formed in the second opening OP2. A pair of protection patterns 47A facing each other in the first direction I may be formed in the second opening OP2. Furthermore, the stack ST may be exposed between the protection patterns 47A. The first material layers 41 may be exposed between the protection patterns 47A.

Figure 8A:
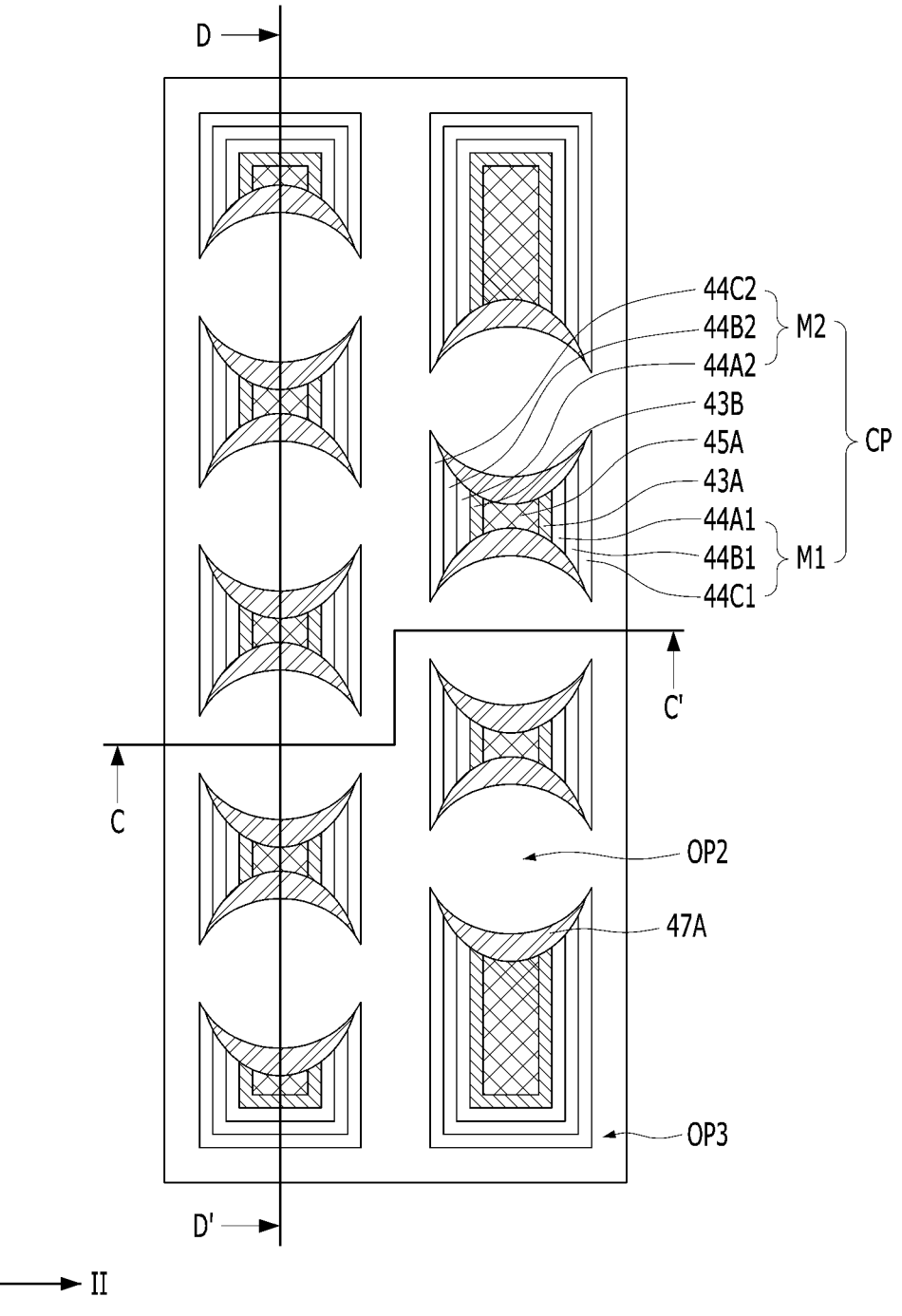
Figure 8B:
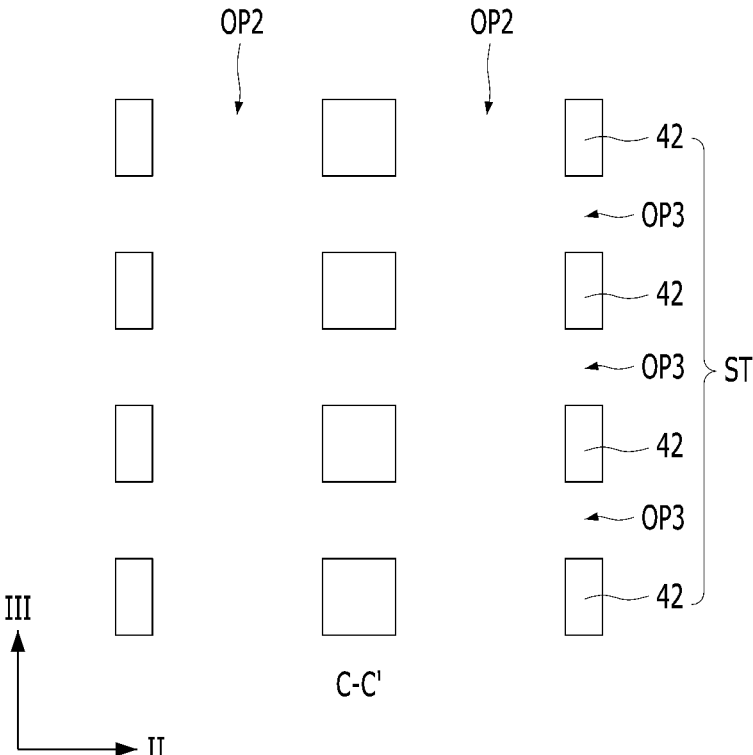
Figure 8C:
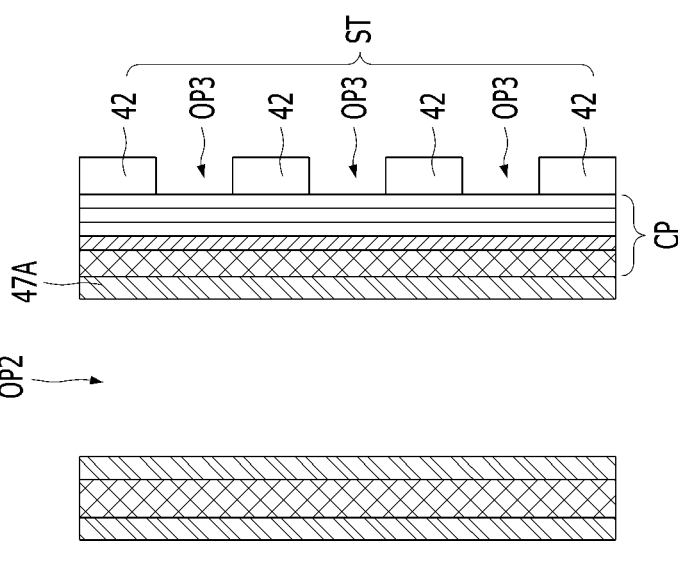
Figure 8C:
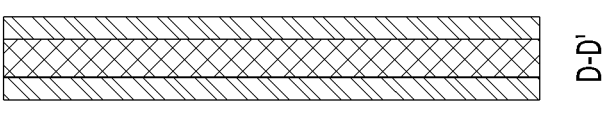
Figure 8C:
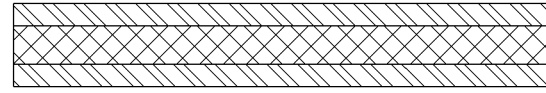
Figure 8C:
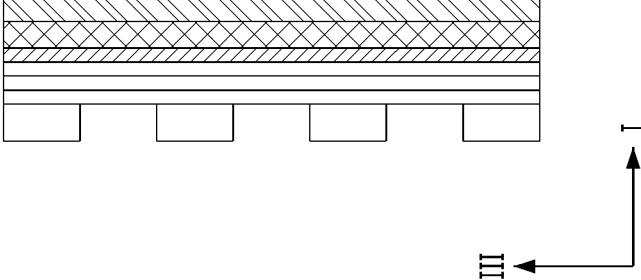

Referring to FIG. 8A to FIG. 8C, third openings OP3 may be formed by removing the first material layers 41 through the second openings OP2. The first material layers 41 exposed between the protection patterns 47A may be selectively etched. In this case, the cell patterns CP may be protected by using the protection patterns 47A as etch barriers. Furthermore, remaining second material layers 42 may be supported by the cell patterns CP and the protection patterns 47A.

Figure 9A:
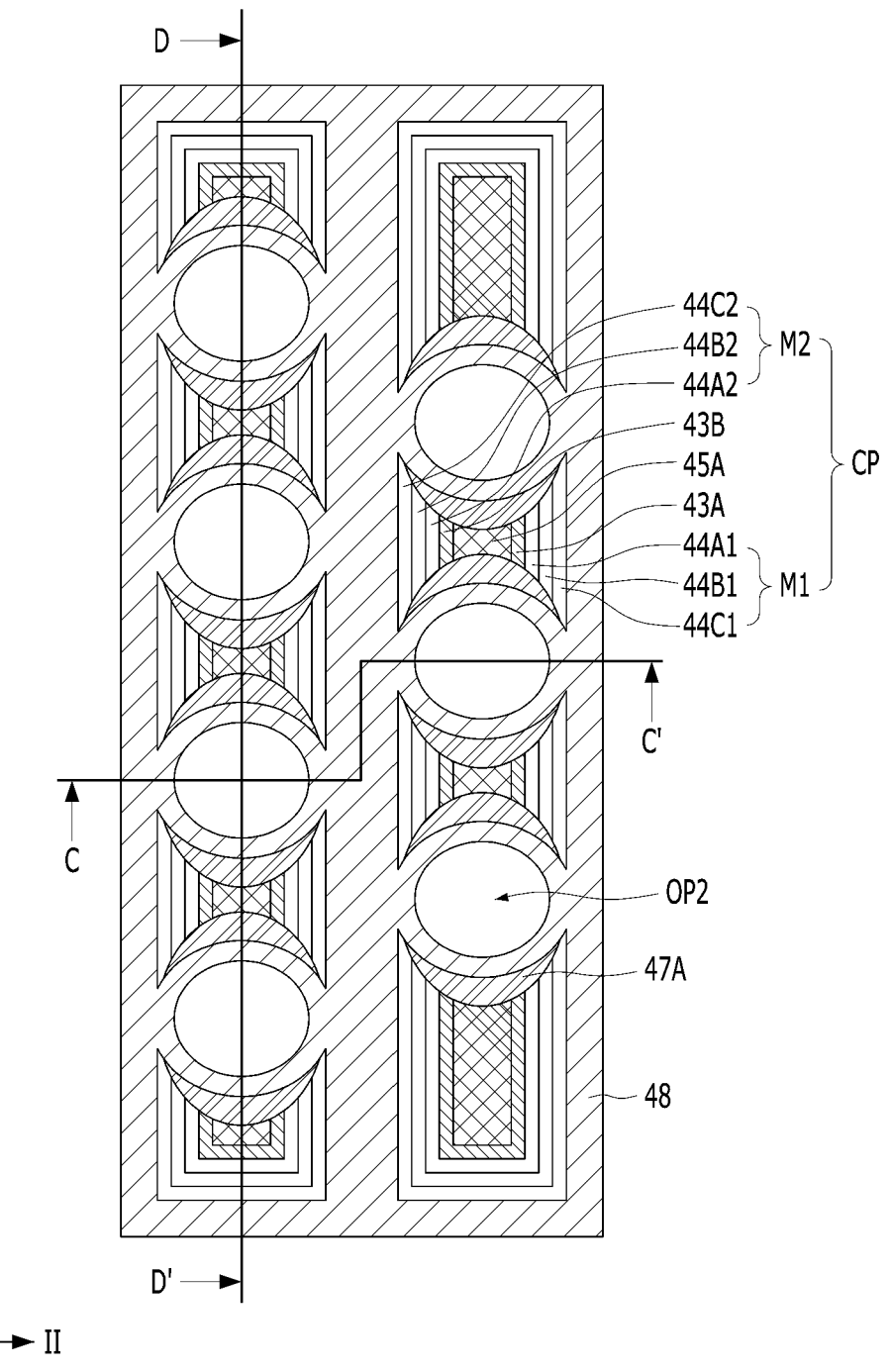
Figure 9B:
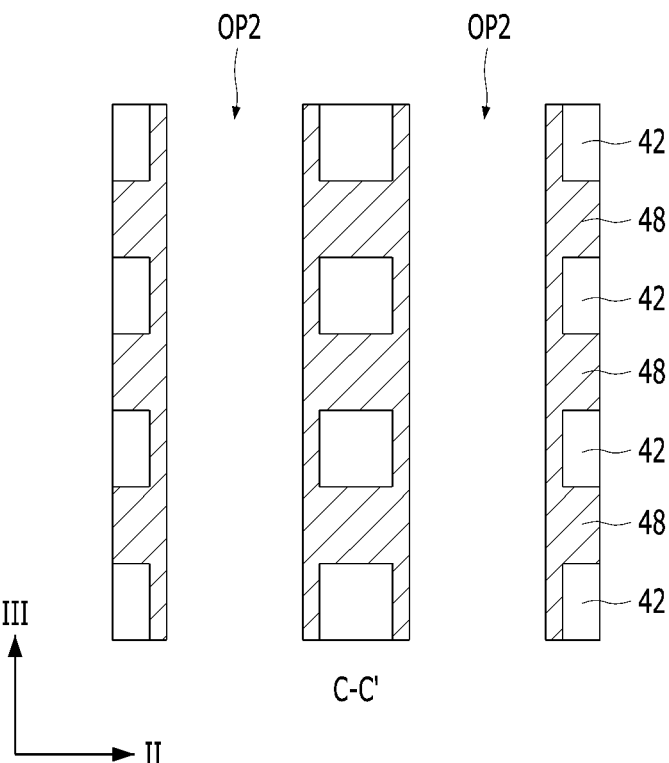
Figure 9C:
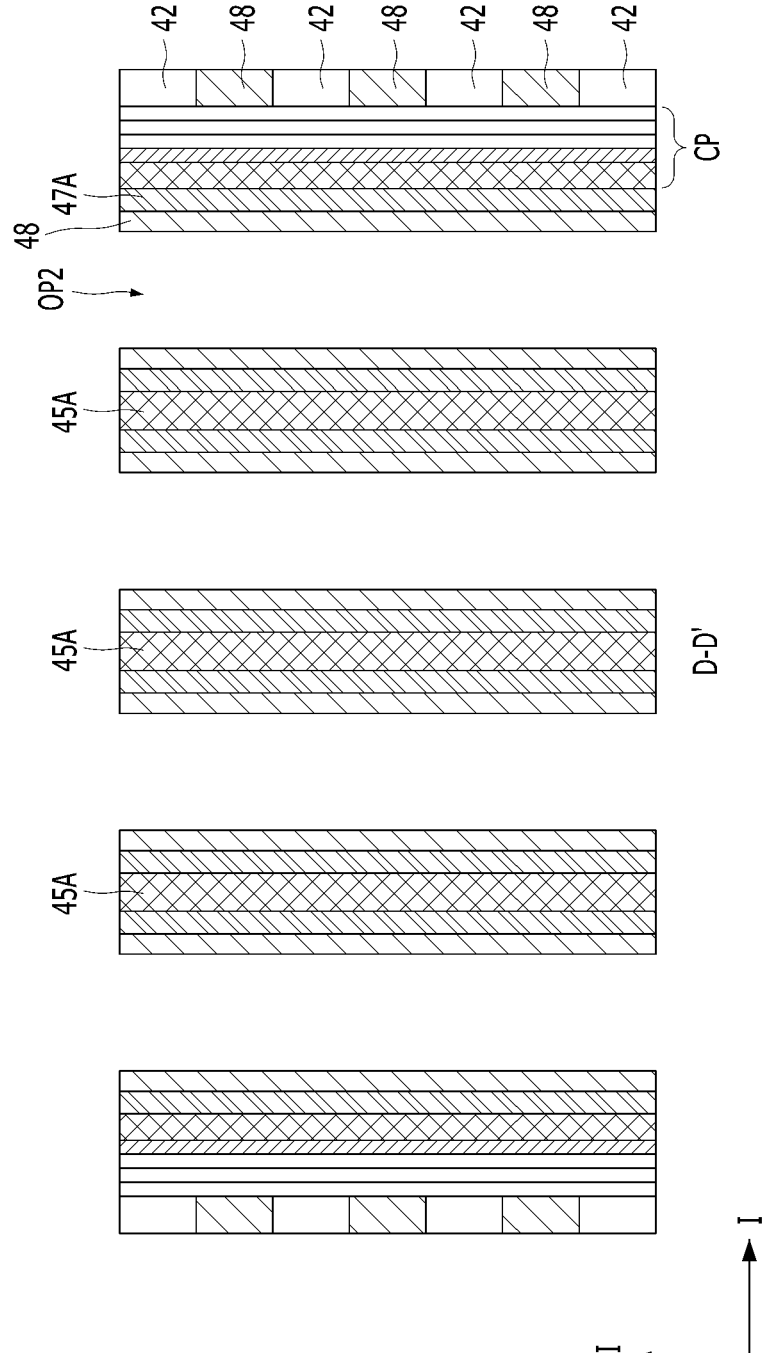

Referring to FIG. 9A to FIG. 9C, a third material 48 may be formed. In an embodiment, the third material 48 may be deposited to fill the third openings OP3. Through this, the third material 48 may be formed in the third openings OP3 and the second openings OP2. The third material 48 may be deposited on the protection patterns 47A. The third material 48 may include a metal such as tungsten or molybdenum.

Figure 10A:
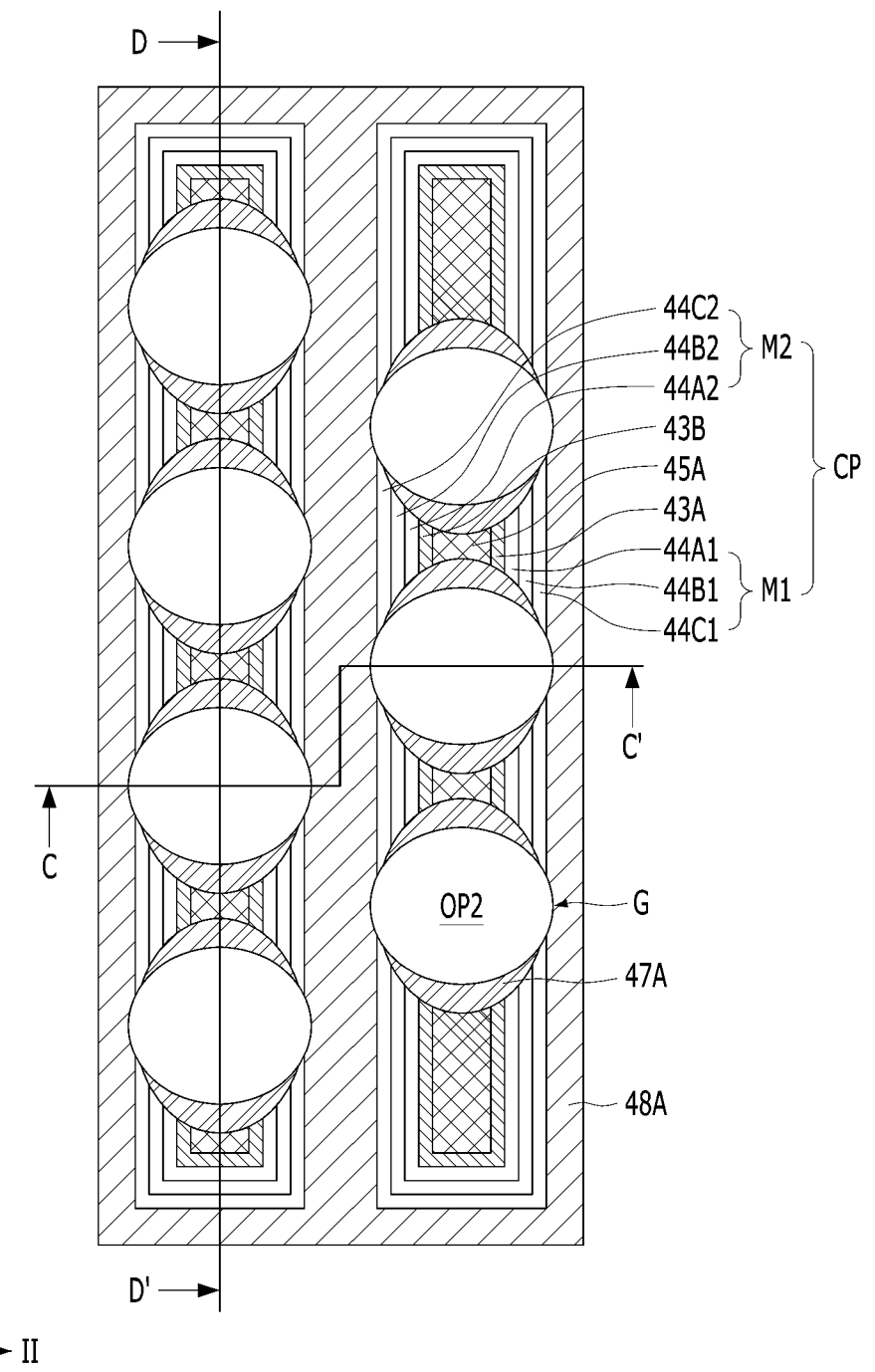
Figure 10B:
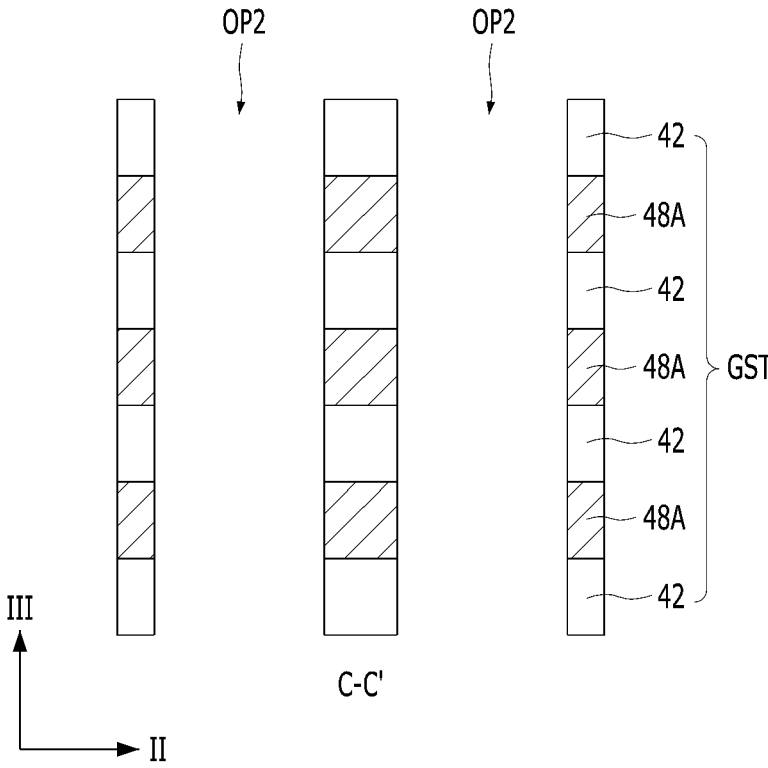
Figure 10C:
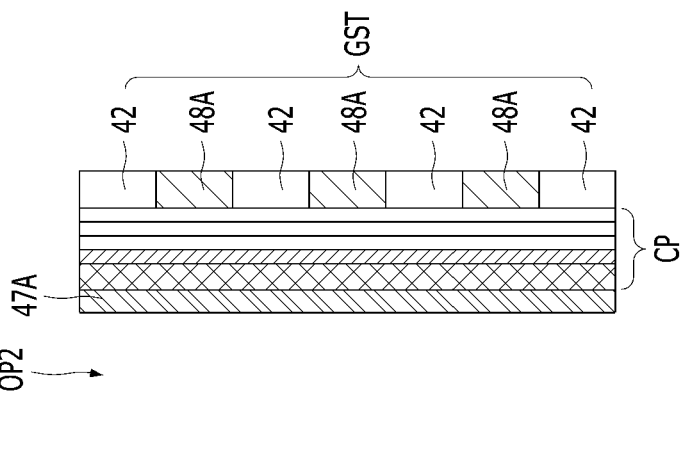
Figure 10C:
Figure 10C:
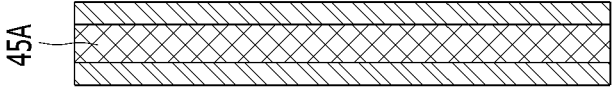
Figure 10C:
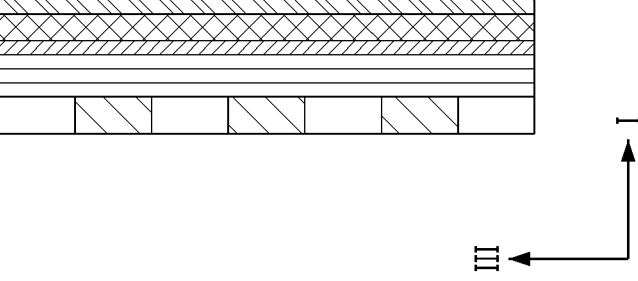

Referring to FIG. 10A to FIG. 10C, third material layers 48A may be formed by etching the third material 48. In an embodiment, by etching the entire surface of the third material 48, a portion of the third material 48 formed in the second opening OP2 may be removed. The third material layers 48A respectively located in the third openings OP3 may be formed, and the third material layers 48A having respective levels may be separated from each other. The third material layers 48A may be exposed through the second opening OP2 and may each include a groove G in the exposed portion. The groove G may be an etched surface formed in the process of etching the third material 48. The groove G may be connected to the second opening OP2, and the width of the second opening OP2 in the second direction II may be increased by the groove G.

Accordingly, the first material layers 41 may be replaced with the third material layers 48A. Furthermore, a gate structure GST including the second material layers 42 and the third material layers 48A that are alternately stacked may be formed. For reference, when the first material layer 41 includes a conductive material, the process of removing the first material layers 41 may be omitted, or the third material layers 48A may be formed by treating the first material layers 41 through a silicidation process or the like.

Figure 11A:
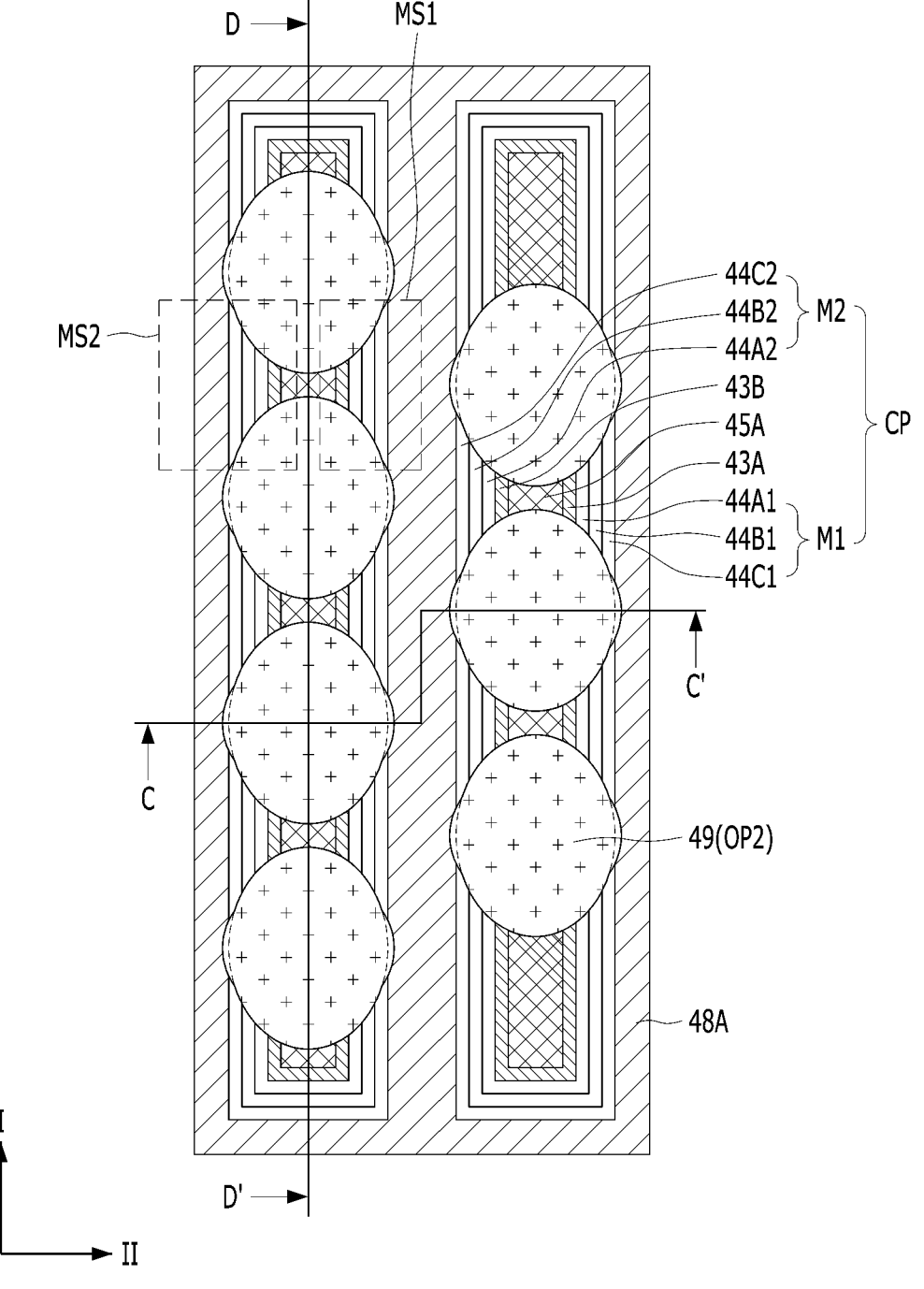
Figure 11B:
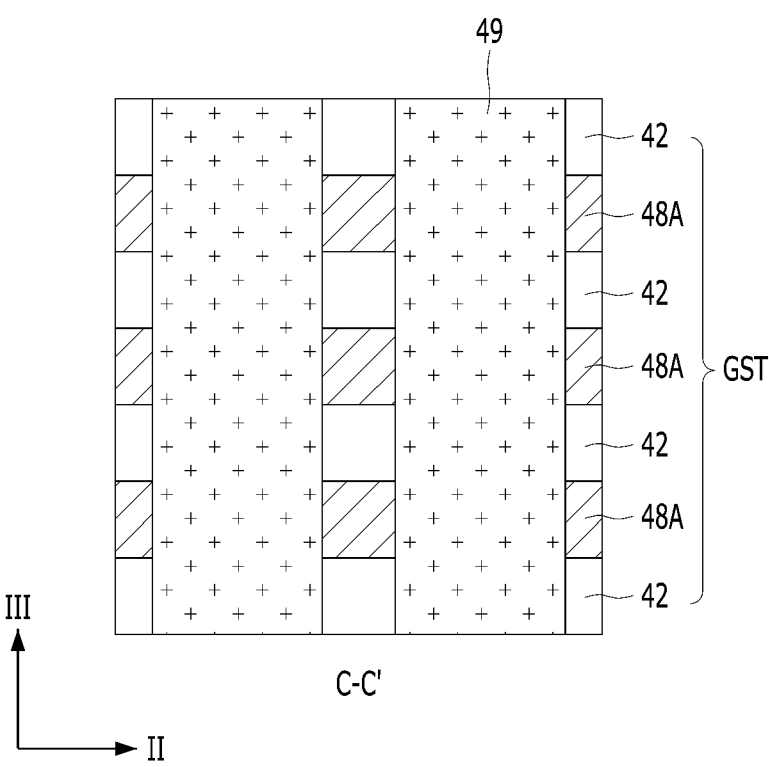
Figure 11C:
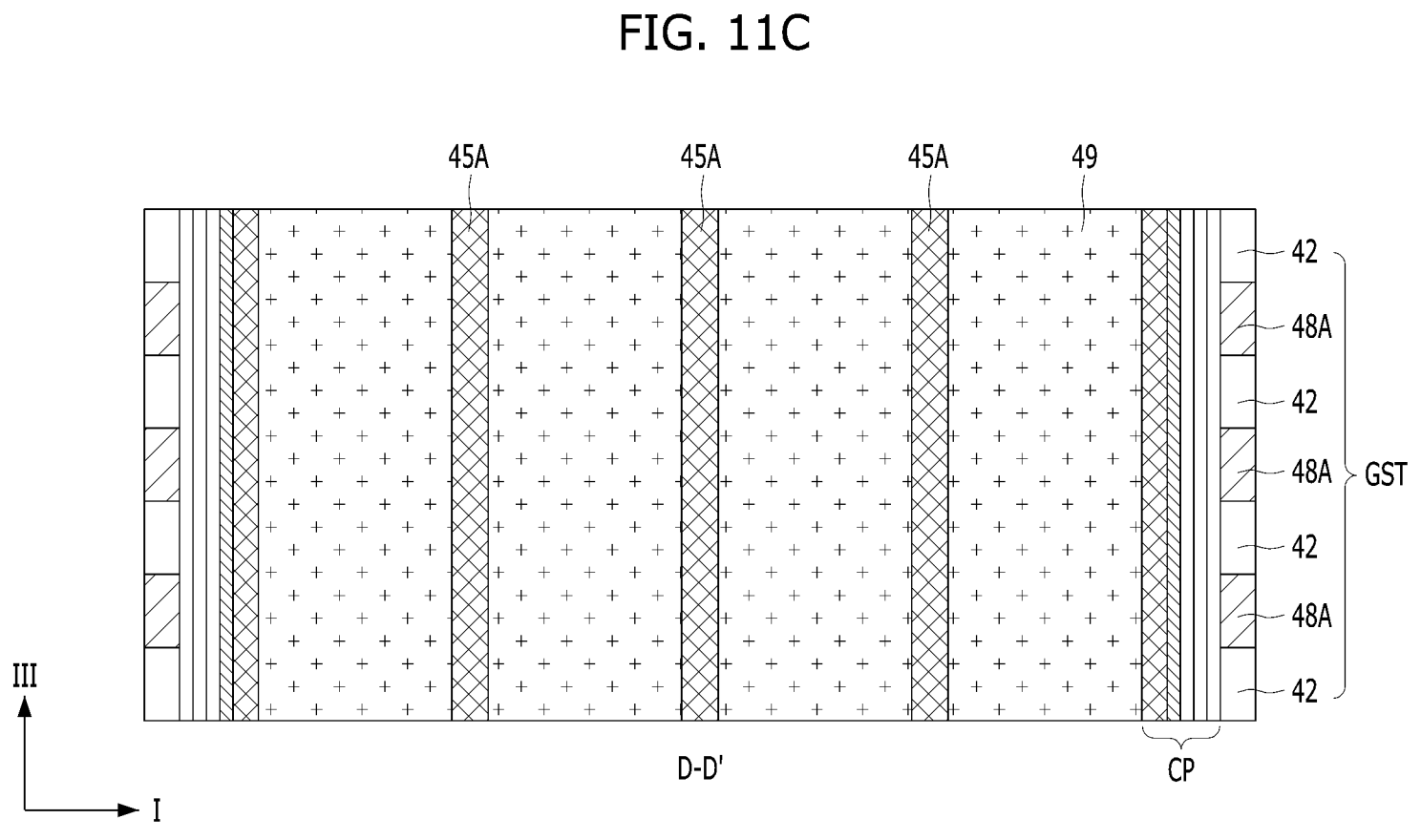

Referring to FIG. 11A to FIG. 11C, the protection patterns 47A may be removed. In an embodiment, the protection patterns 47A may be selectively etched using a wet etching process. Subsequently, second insulating pillars 49 may be formed in the second openings OP2. The second insulating pillars 49 may each include an insulating material such as oxide, nitride, or an air gap.

Accordingly, first memory strings MS1 and second memory strings MS2 may be formed in the first opening OP1. The first memory strings MS1 adjacent in the first direction I within the first opening OP1 may be separated from each other by the second insulating pillars 49. The second memory strings MS2 adjacent in the first direction I within the first opening OP1 may be separated from each other by the second insulating pillars 49. The first memory string MS1 and the second memory string MS2 adjacent in the second direction II within the first opening OP1 may be separated from each other by the first insulating pillar 45A.

According to the manufacturing method described above, the cell structure CS may be formed in the first opening OP1 having a line shape and the cell patterns CP may be formed by dividing the cell structure CS. Accordingly, a plurality of memory strings MS1 and MS2 may be formed in one first opening OP1, and the degree of integration of the semiconductor device may be improved. Furthermore, the protection patterns 47A may be formed using the shape of the second opening OP2, and when the first material layers 41 are replaced with the third material layers 48A, the cell patterns CP may be protected by the protection patterns 47A.

FIG. 12A to FIG. 12C and FIG. 13A to FIG. 13C are simplified schematic diagrams for describing a method of manufacturing a semiconductor device in accordance with an embodiment of the present invention. Hereinafter, the content overlapping with the previously described content may be omitted.

Figure 12A:
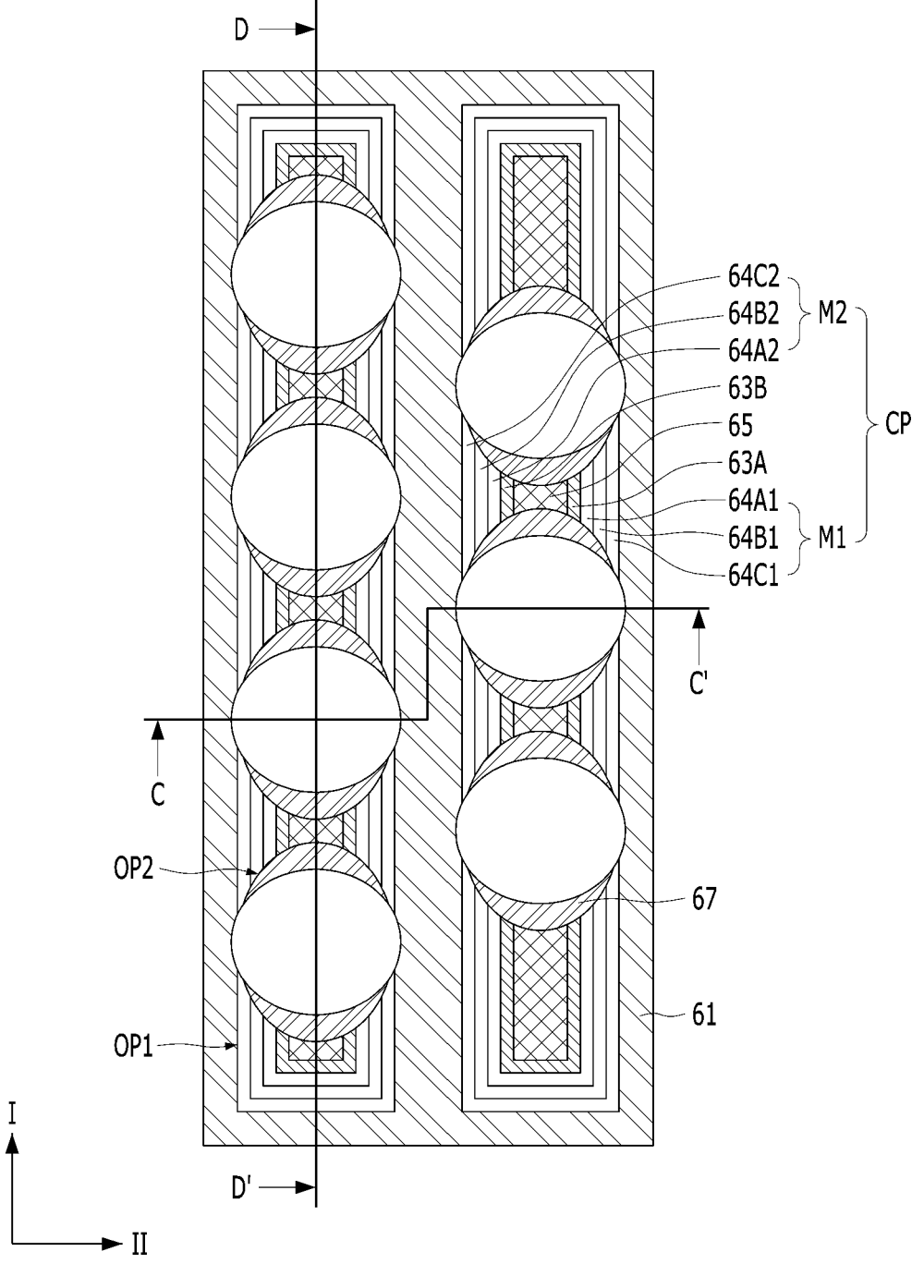
Figure 12B:
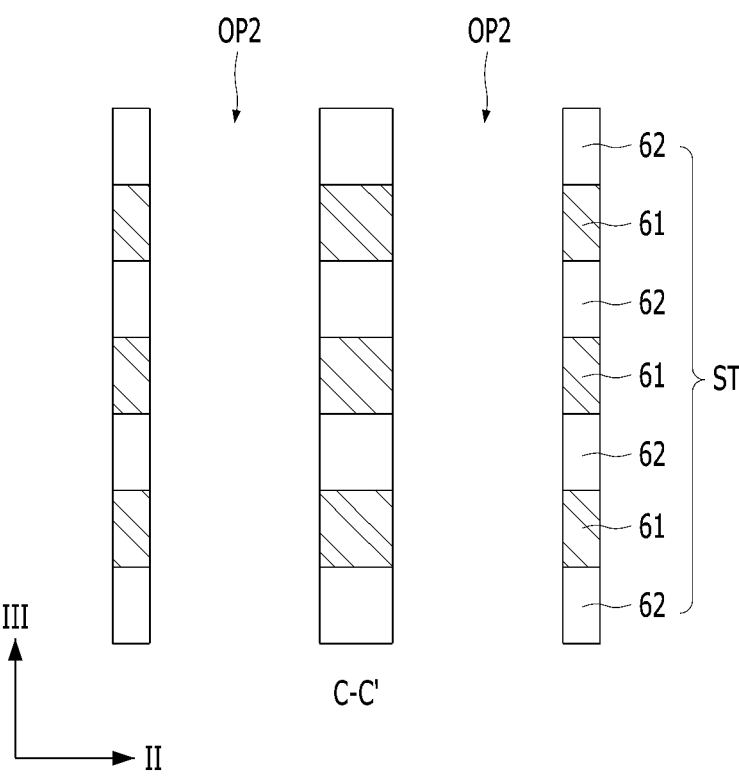
Figure 12C:
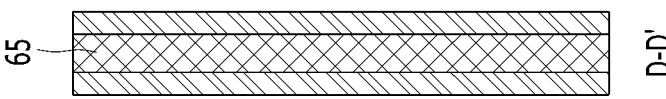
Figure 12C:
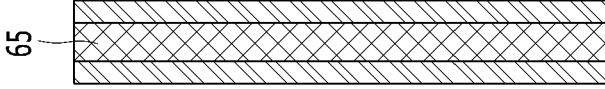
Figure 12C:
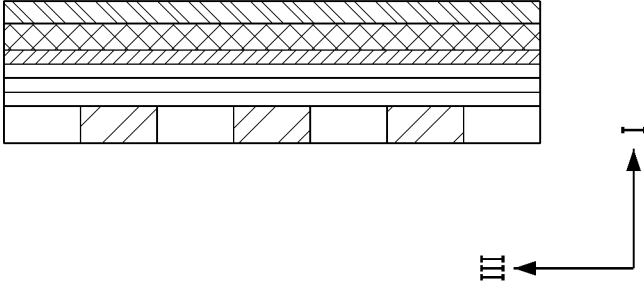

Referring to FIG. 12A to FIG. 12C, a stack ST including first material layers 61 and second material layers 62 that are alternately stacked may be formed. Subsequently, a first opening OP1 having a line shape and extending in the first direction I may be formed in the stack ST. Subsequently, after a cell structure is formed in the first opening OP1, second openings OP2 may be formed to separate the cell structure into cell patterns CP. The cell patterns CP may each include a first insulating pillar 65, a first channel pattern 63A, a first memory pattern M1, a second channel pattern 63B, and a second memory pattern M2. The first memory pattern M1 may include a first tunneling pattern 64A1, a first data storage pattern 6461, or a first blocking pattern 64C1, or a combination thereof. The second memory pattern M2 may include a second tunneling pattern 64A2, a second data storage pattern 64B2, or a second blocking pattern 64C2, or a combination thereof.

Subsequently, protection patterns 67 may be formed in the second openings OP2. The protection patterns 67 may be formed on etched surfaces of the cell patterns CP. The stack ST may be exposed between the protection patterns 67, and the first material layers 61 may be exposed between the protection patterns 67. The protection patterns 67 may each include a material having a high etching selectivity with respect to the first material layers 61 and may each include an insulating material. In an embodiment, the protection patterns 67 may each include an oxide.

Figure 13A:
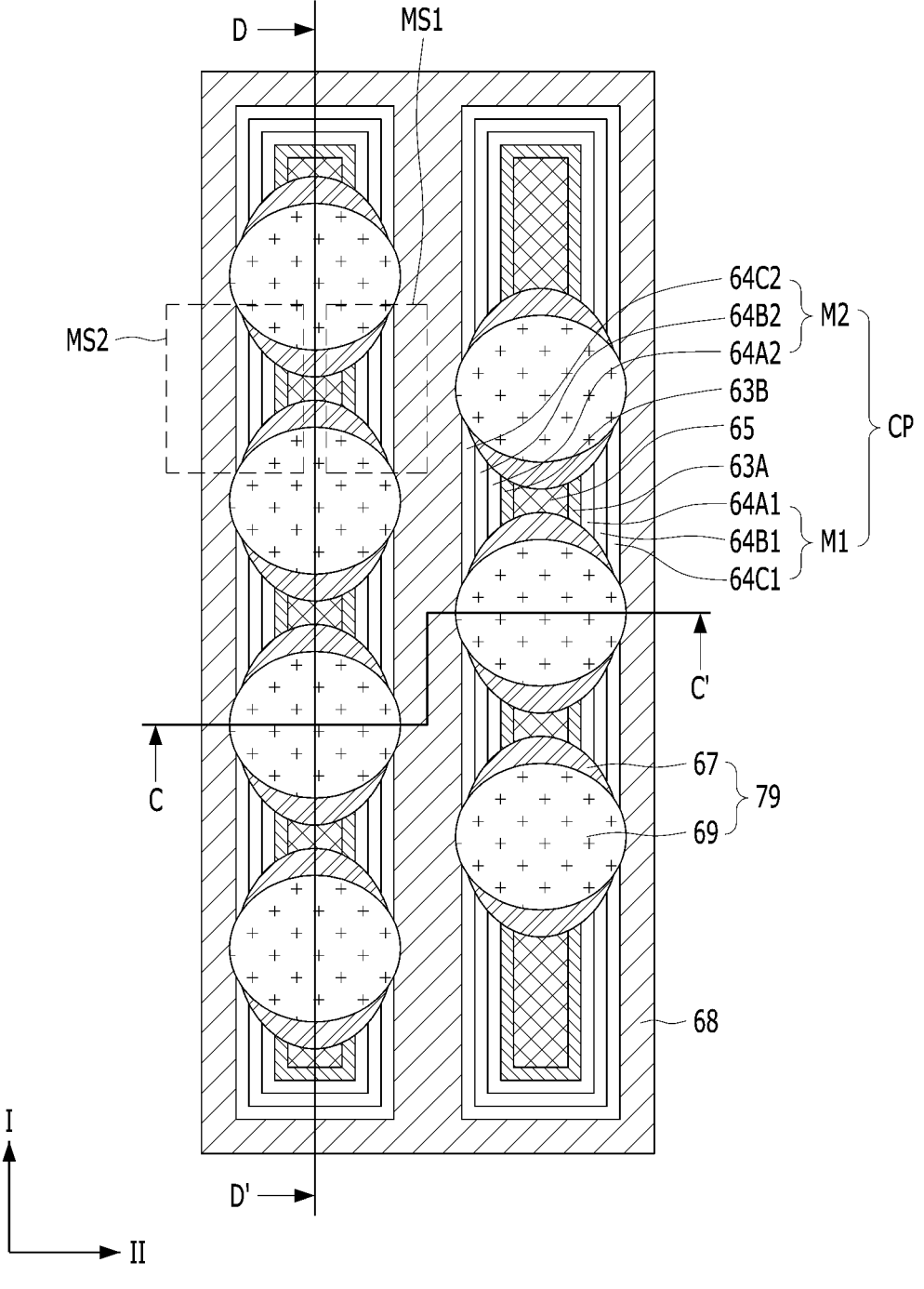
Figure 13B:
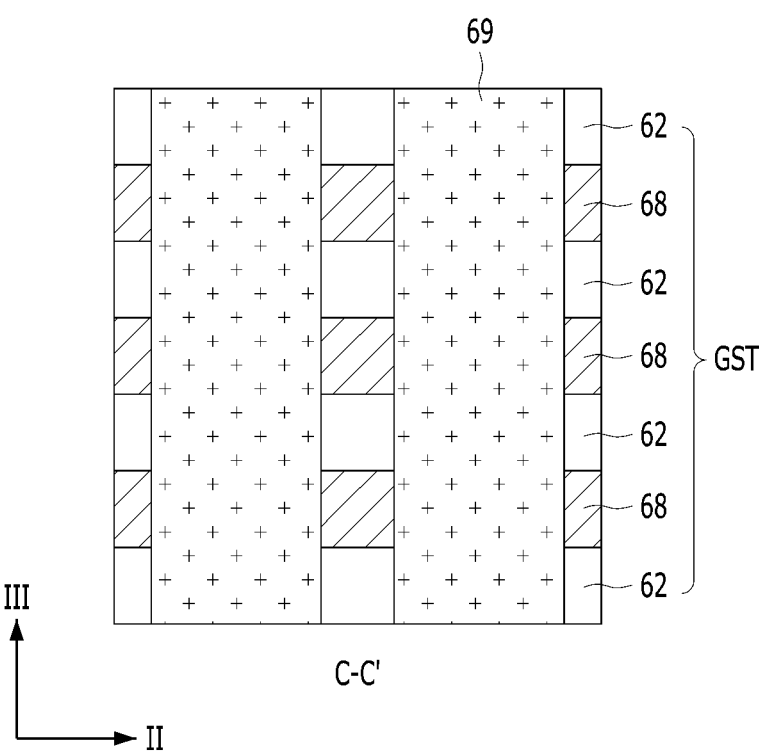
Figure 13C:
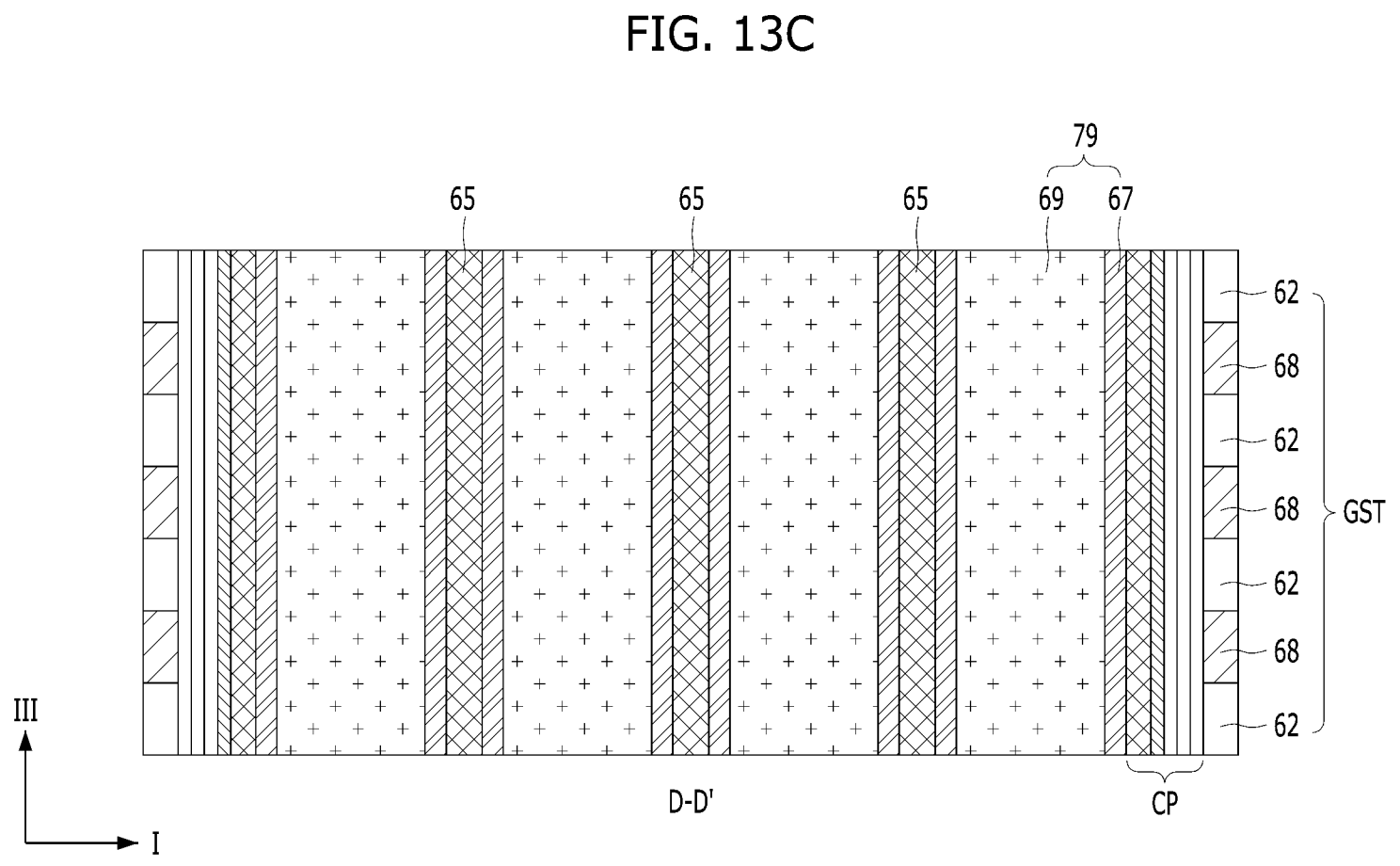

Referring to FIG. 13A to FIG. 13C, the first material layers 61 may be replaced with third material layers 68 through the second openings OP2. In this case, the cell patterns CP may be protected by the protection patterns 67. Subsequently, insulating layers 69 may be formed in the second openings OP2 in the state in which the protection patterns 67 remain. The insulating layers 69 may each include a long axis extending in the second direction II and a short axis extending in the first direction I. Through this, second insulating pillars 79 each including the insulating layer 69 and the protection patterns 67 may be formed.

According to the manufacturing method described above, the first memory strings MS1 and the second memory strings MS2 separated from each other by the first insulating pillars 65 and the second insulating pillars 79 may be formed in the first opening OP1 having a line shape. Furthermore, when the first material layers 61 are replaced with the third material layers 68, the cell patterns CP may be protected by the protection patterns 67.

Although embodiments according to the technical idea of the present invention disclosure have been described above with reference to the accompanying drawings, this is only for describing the embodiments according to the concept of the present invention disclosure, and the present invention disclosure is not limited to the above embodiments. Various types of substitutions, modifications, and changes for the embodiments may be made by those skilled in the art, to which the present invention disclosure pertains, without departing from the technical idea of the present invention disclosure defined in the following claims, and it should be construed that these substitutions, modifications, and changes belong to the scope of the present invention disclosure.

What is claimed is:

1. A semiconductor device comprising:
first insulating pillars arranged in a first direction;
second insulating pillars arranged alternately with the first insulating pillars and having a first width in the first direction and a second width in a second direction intersecting the first direction, the first width being greater than the second width;
first memory cells located between the second insulating pillars and stacked along a first sidewall of each of the first insulating pillars; and
second memory cells located between the second insulating pillars and stacked along a second sidewall of each of the first insulating pillars,
wherein each of the first insulating pillars is disposed between the first memory cells and the second memory cells.

2. The semiconductor device of claim 1, wherein the first memory cells face the second memory cells in the second direction with the first insulating pillars interposed between the first memory cells and the second memory cells.

3. The semiconductor device of claim 1, wherein the first memory cells and the second memory cells are arranged in a plurality of pairs, each pair including one of the first memory cells and one of the second memory cells, and
wherein one of the first memory cells and one of the second memory cells have a symmetrical structure and are positioned to face each other with one of the first insulating pillars interposed therebetween.

4. The semiconductor device of claim 1, wherein each of the first memory cells comprises:
a first channel pattern surrounding the first sidewall with a first length; and
a first memory pattern surrounding the first channel pattern with a second length longer than the first length.

5. The semiconductor device of claim 1, wherein the first sidewall faces the second sidewall in the second direction.

6. The semiconductor device of claim 1, wherein each of the first insulating pillars comprises a third sidewall and a fourth sidewall facing each other in the first direction and being in contact with the second insulating pillars.

7. The semiconductor device of claim 6, wherein the first sidewall and the second sidewall each include a flat surface and the third sidewall and the fourth sidewall each include a curved surface.

8. The semiconductor device of claim 1, wherein each of the second insulating pillars comprises:
a body comprising a long axis extending in the first direction and a short axis extending in the second direction;
a first protrusion protruding from the body, wherein the first protrusion protrudes between the first memory cells adjacent in the first direction; and
a second protrusion protruding from the body, wherein the second protrusion protrudes between the second memory cells adjacent in the first direction.

9. The semiconductor device of claim 1, wherein each of the second insulating pillars comprises:
an insulating layer comprising a long axis extending in the second direction and a short axis extending in the first direction; and
protection patterns located between the insulating layer and the first insulating pillars.

10. A semiconductor device comprising:
a gate structure comprising gate lines and insulating layers that are alternately stacked;

first insulating pillars located in the gate structure and arranged in a first direction;
second insulating pillars located between the first insulating pillars and comprising insulating layers each having a first width in the first direction and a second width in a second direction intersecting the first direction, the second width being greater than the first width;
first memory patterns located in the gate structure and between the second insulating pillars; and
second memory patterns located in the gate structure and between the second insulating pillars,
wherein the first memory patterns are spaced apart from the second memory patterns in the second direction and the first insulating pillars are disposed between the first memory patterns and the second memory patterns.

11. The semiconductor device of claim 10, wherein each of the second insulating pillars comprises protection patterns located between the insulating layer and the first insulating pillars.

12. The semiconductor device of claim 11, wherein each of the second insulating pillars has a third width in the first direction and a fourth width in the second direction, the third width being greater than the fourth width.

13. The semiconductor device of claim 11, wherein each of the gate lines comprises grooves located between the protection patterns.

14. The semiconductor device of claim 11, wherein the insulating layer and the protection patterns each comprise oxide.

15. The semiconductor device of claim 10, wherein the memory patterns comprise:
first memory patterns located between the second insulating pillars and formed on a first sidewall of each of the first insulating pillars; and
second memory patterns located between the second insulating pillars and formed on a second sidewall of each of the first insulating pillars.

16. A semiconductor device comprising:
first insulating pillars arranged in a first direction;
second insulating pillars arranged alternately with the first insulating pillars and having a first width in the first direction and a second width in a second direction intersecting the first direction, the first width being greater than the second width;
first memory cells located between the second insulating pillars and stacked along a first sidewall of each of the first insulating pillars; and
second memory cells located between the second insulating pillars and stacked along a second sidewall of each of the first insulating pillars,
wherein a first memory cell and a second memory cell adjacent in the second direction form a pair with a first insulating pillar disposed therebetween.

17. A semiconductor device comprising:
a gate structure comprising gate lines and insulating layers that are alternately stacked;
first insulating pillars disposed in the gate structure and arranged in a first direction;
second insulating pillars disposed between the first insulating pillars and comprising insulating layers each having a first width in the first direction and a second width in a second direction intersecting the first direction, the first width being greater than the second width; and
memory patterns disposed in the gate structure and separated from each other by the first insulating pillars and the second insulating pillars, wherein each of the second insulating pillars comprises
protection patterns located between the insulating layer
and the first insulating pillars.

\* \* \* \* \*